US012777967B2

(12) United States Patent
Fountain, Jr.

(10) Patent No.: US 12,777,967 B2
(45) Date of Patent: Oct. 27, 2026

(54) ELEMENT WITH ROUTING STRUCTURE IN BONDING LAYER

(71) Applicant: Invensas Bonding Technologies, Inc., San Jose, CA (US)

(72) Inventor: Gaius Gillman Fountain, Jr., Youngsville, NC (US)

(73) Assignee: Adeia Semiconductor Bonding Technologies, Inc., San Jose, CA (US)

( * ) Notice: Subject to any disclaimer, the term of this patent is extended or adjusted under 35 U.S.C. 154(b) by 510 days.

(21) Appl. No.: 17/809,723

(22) Filed: Jun. 29, 2022

(65) Prior Publication Data

US 2023/0005850 A1 Jan. 5, 2023

Related U.S. Application Data

(60) Provisional application No. 63/217,046, filed on Jun. 30, 2021.

(51) Int. Cl.
*H10W 90/00* (2026.01)
*H10W 70/05* (2026.01)
(Continued)

(52) U.S. Cl.
CPC ........... *H10W 90/00* (2026.01); *H10W 80/00* (2026.01); *H10W 80/301* (2026.01); *H10W 80/312* (2026.01); *H10W 80/314* (2026.01); *H10W 80/327* (2026.01); *H10W 70/05* (2026.01); *H10W 70/093* (2026.01); *H10W 70/60* (2026.01); *H10W 70/65* (2026.01);
(Continued)

(58) Field of Classification Search
None
See application file for complete search history.

(56) References Cited

U.S. PATENT DOCUMENTS 4,998,665 A 3/1991 Hayashi
5,019,673 A 5/1991 Juskey et al.
(Continued)

FOREIGN PATENT DOCUMENTS

CN 103681646 3/2014
EP 1011133 A1 6/2000
(Continued)

OTHER PUBLICATIONS

Amirfeiz et al., "Formation of silicon structures by plasma-activated wafer bonding," Journal of The Electrochemical Society, 2000, vol. 147, No. 7, pp. 2693-2698.
(Continued)

*Primary Examiner* — Julio J Maldonado
*Assistant Examiner* — Pinaki Das
(74) *Attorney, Agent, or Firm* — Knobbe, Martens, Olson & Bear, LLP

(57) ABSTRACT

A bonded structure is disclosed. The bonded structure can include a first element that includes a first bonding layer, the first bonding layer that has a first contact pad and a routing trace. The routing trace is formed at the same level as the first contact pad. The bonded structure can include a second element that includes a second bonding layer that has a second contact pad. The first element and the second element are directly bonded such that the first contact pad and the second contact pad are directly bonded without an intervening adhesive.

27 Claims, 12 Drawing Sheets

(51) Int. Cl.

| | |
|---|---|
| *H10W 70/60* | (2026.01) |
| *H10W 70/65* | (2026.01) |
| *H10W 70/652* | (2026.01) |
| *H10W 70/654* | (2026.01) |
| *H10W 70/66* | (2026.01) |
| *H10W 72/00* | (2026.01) |
| *H10W 72/90* | (2026.01) |
| *H10W 80/00* | (2026.01) |
| *H10W 90/26* | (2026.01) |

(52) U.S. Cl.

CPC ........ *H10W 70/652* (2026.01); *H10W 70/654* (2026.01); *H10W 70/66* (2026.01); *H10W 72/01935* (2026.01); *H10W 72/01938* (2026.01); *H10W 72/07331* (2026.01); *H10W 72/07332* (2026.01); *H10W 72/921* (2026.01); *H10W 72/922* (2026.01); *H10W 72/932* (2026.01); *H10W 72/934* (2026.01); *H10W 72/9415* (2026.01); *H10W 72/9445* (2026.01); *H10W 72/951* (2026.01); *H10W 72/952* (2026.01); *H10W 90/26* (2026.01); *H10W 90/792* (2026.01)

(56) References Cited

U.S. PATENT DOCUMENTS 5,051,802 A 9/1991 Prost et al.
5,087,585 A 2/1992 Hayashi
5,322,593 A 6/1994 Hasegawa et al.
5,753,536 A 5/1998 Sugiyama et al.
5,771,555 A 6/1998 Eda et al.
5,854,507 A 12/1998 Miremadi et al.
5,956,605 A 9/1999 Akram et al.
5,985,739 A 11/1999 Plettner et al.
5,998,808 A 12/1999 Matsushita
6,008,126 A 12/1999 Leedy
6,080,640 A 6/2000 Gardner et al.
6,121,688 A 9/2000 Akagawa
6,265,775 B1 7/2001 Seyyedy
6,374,770 B1 4/2002 Lee
6,423,640 B1 7/2002 Lee et al.
6,465,892 B1 10/2002 Suga
6,582,991 B1 6/2003 Maeda et al.
6,768,208 B2 7/2004 Lin et al.
6,782,610 B1 8/2004 Lijima et al.
6,887,769 B2 5/2005 Kellar et al.
6,908,027 B2 6/2005 Tolchinsky et al.
7,045,453 B2 5/2006 Canaperi et al.
7,078,811 B2 7/2006 Suga
7,105,980 B2 9/2006 Abbott et al.
7,126,212 B2 10/2006 Enquist et al.
7,193,423 B1 3/2007 Dalton et al.
7,319,197 B2 1/2008 Oggioni et al.
7,354,798 B2 4/2008 Pogge et al.
7,385,283 B2 6/2008 Wu et al.
7,554,203 B2 6/2009 Zhou et al.
7,566,634 B2 7/2009 Beyne et al.
7,582,971 B2 9/2009 Kameyama et al.
7,589,409 B2 9/2009 Gibson et al.
7,663,231 B2 2/2010 Chang et al.
7,750,488 B2 7/2010 Patti et al.
7,759,751 B2 7/2010 Ono
7,786,572 B2 8/2010 Chen
7,803,693 B2 9/2010 Trezza
7,843,052 B1 11/2010 Yoo et al.
7,897,481 B2 3/2011 Chiou et al.
7,932,616 B2 4/2011 Meguro
7,977,789 B2 7/2011 Park
8,049,303 B2 11/2011 Osaka et al.
8,064,224 B2 11/2011 Mahajan et al.
8,168,458 B2 5/2012 Do et al.
8,178,963 B2 5/2012 Yang
8,178,964 B2 5/2012 Yang
8,183,127 B2 5/2012 Patti et al.
8,193,632 B2 6/2012 Chang et al.
8,227,904 B2 7/2012 Braunisch et al.
8,241,961 B2 8/2012 Kim et al.
8,263,434 B2 9/2012 Pagaila et al.
8,314,007 B2 11/2012 Vaufredaz
8,349,635 B1 1/2013 Gan et al.
8,377,798 B2 2/2013 Peng et al.
8,441,131 B2 5/2013 Ryan
8,476,146 B2 7/2013 Chen et al.
8,476,165 B2 7/2013 Trickett et al.
8,482,132 B2 7/2013 Yang et al.
8,501,537 B2 8/2013 Sadaka et al.
8,519,514 B2 8/2013 Fujii
8,524,533 B2 9/2013 Tong et al.
8,620,164 B2 12/2013 Heck et al.
8,647,987 B2 2/2014 Yang et al.
8,691,601 B2 4/2014 Izuha
8,697,493 B2 4/2014 Sadaka
8,716,105 B2 5/2014 Sadaka et al.
8,791,575 B2 7/2014 Oganesian et al.
8,802,538 B1 8/2014 Liu
8,809,123 B2 8/2014 Liu et al.
8,841,002 B2 9/2014 Tong
8,878,353 B2 11/2014 Haba et al.
8,901,748 B2 12/2014 Manusharow et al.
8,912,670 B2 12/2014 Teh et al.
8,975,726 B2 3/2015 Chen et al.
8,987,137 B2 3/2015 Bachman et al.
8,988,299 B2 3/2015 Kam et al.
9,006,908 B2 4/2015 Pincu et al.
9,029,242 B2 5/2015 Holden et al.
9,054,101 B2 6/2015 Semmelmeyer et al.
9,093,350 B2 7/2015 Endo et al.
9,126,236 B2 9/2015 Roos et al.
9,136,293 B2 9/2015 Yee et al.
9,142,517 B2 9/2015 Liu et al.
9,153,552 B2 10/2015 Teh et al.
9,159,690 B2 10/2015 Chiu
9,171,756 B2 10/2015 Enquist et al.
9,171,816 B2 10/2015 Teh et al.
9,184,125 B2 11/2015 Enquist et al.
9,190,380 B2 11/2015 Teh et al.
9,224,697 B1 12/2015 Kwon et al.
9,224,704 B2 12/2015 Landru
9,230,941 B2 1/2016 Chen et al.
9,252,172 B2 2/2016 Chow et al.
9,257,399 B2 2/2016 Kuang et al.
9,269,701 B2 2/2016 Starkston et al.
9,275,971 B2 3/2016 Chiu et al.
9,299,736 B2 3/2016 Chen et al.
9,312,198 B2 4/2016 Meyer et al.
9,312,229 B2 4/2016 Chen et al.
9,331,149 B2 5/2016 Tong et al.
9,337,235 B2 5/2016 Chen et al.
9,349,703 B2 5/2016 Chiu et al.
9,355,997 B2 5/2016 Katkar et al.
9,368,866 B2 6/2016 Yu
9,373,527 B2 6/2016 Yu et al.
9,385,024 B2 7/2016 Tong et al.
9,394,161 B2 7/2016 Cheng et al.
9,431,368 B2 8/2016 Enquist et al.
9,437,572 B2 9/2016 Chen et al.
9,443,796 B2 9/2016 Chou et al.
9,443,824 B1 9/2016 We et al.
9,461,007 B2 10/2016 Chun et al.
9,466,586 B1 10/2016 Choi et al.
9,476,898 B2 10/2016 Takano
9,496,239 B1 11/2016 Edelstein et al.
9,524,959 B1 12/2016 Yeh et al.
9,536,848 B2 1/2017 England et al.
9,559,081 B1 1/2017 Lai et al.
9,601,353 B2 3/2017 Huang et al.
9,620,481 B2 4/2017 Edelstein et al.
9,627,365 B1 4/2017 Yu et al.
9,656,852 B2 5/2017 Cheng et al.
9,666,502 B2 5/2017 Chen et al.
9,666,559 B2 5/2017 Wang et al.
9,704,827 B2 7/2017 Huang et al.

(56) References Cited

U.S. PATENT DOCUMENTS

| | | | |
|---|---|---|---|
| 9,722,098 | B1 | 8/2017 | Chung et al. |
| 9,723,716 | B2 | 8/2017 | Meinhold |
| 9,728,521 | B2 | 8/2017 | Tsai et al. |
| 9,741,620 | B2 | 8/2017 | Uzoh et al. |
| 9,768,133 | B1 | 9/2017 | Wu et al. |
| 9,799,587 | B2 | 10/2017 | Fujii et al. |
| 9,818,729 | B1 | 11/2017 | Chiu et al. |
| 9,852,988 | B2 | 12/2017 | Enquist et al. |
| 9,881,882 | B2 | 1/2018 | Hsu et al. |
| 9,893,004 | B2 | 2/2018 | Yazdani |
| 9,899,442 | B2 | 2/2018 | Katkar |
| 9,929,050 | B2 | 3/2018 | Lin |
| 9,941,241 | B2 | 4/2018 | Edelstein et al. |
| 9,941,243 | B2 | 4/2018 | Kim et al. |
| 9,953,941 | B2 | 4/2018 | Enquist |
| 9,960,142 | B2 | 5/2018 | Chen et al. |
| 9,966,360 | B2 | 5/2018 | Yu et al. |
| 10,002,844 | B1 | 6/2018 | Wang et al. |
| 10,008,844 | B2 | 6/2018 | Wang et al. |
| 10,026,605 | B2 | 7/2018 | Doub et al. |
| 10,032,722 | B2 | 7/2018 | Yu et al. |
| 10,075,657 | B2 | 9/2018 | Fahim et al. |
| 10,170,409 | B2 | 1/2019 | Ganesan et al. |
| 10,204,893 | B2 | 2/2019 | Uzoh et al. |
| 10,269,619 | B2 | 4/2019 | Yu et al. |
| 10,269,756 | B2 | 4/2019 | Uzoh |
| 10,269,853 | B2 | 4/2019 | Katkar et al. |
| 10,276,619 | B2 | 4/2019 | Kao et al. |
| 10,276,909 | B2 | 4/2019 | Huang et al. |
| 10,418,277 | B2 | 9/2019 | Cheng et al. |
| 10,446,456 | B2 | 10/2019 | Shen et al. |
| 10,446,532 | B2 | 10/2019 | Uzoh et al. |
| 10,508,030 | B2 | 12/2019 | Katkar et al. |
| 10,522,499 | B2 | 12/2019 | Enquist et al. |
| 10,529,690 | B2 | 1/2020 | Shih et al. |
| 10,559,507 | B1 | 2/2020 | Saketi et al. |
| 10,707,087 | B2 | 7/2020 | Uzoh et al. |
| 10,707,145 | B2 | 7/2020 | Bultitude et al. |
| 10,727,204 | B2 | 7/2020 | Agarwal et al. |
| 10,727,219 | B2 | 7/2020 | Uzoh et al. |
| 10,784,191 | B2 | 9/2020 | Huang et al. |
| 10,790,262 | B2 | 9/2020 | Uzoh et al. |
| 10,840,135 | B2 | 11/2020 | Uzoh |
| 10,840,205 | B2 | 11/2020 | Fountain, Jr. et al. |
| 10,854,578 | B2 | 12/2020 | Morein |
| 10,879,212 | B2 | 12/2020 | Uzoh et al. |
| 10,886,177 | B2 | 1/2021 | DeLaCruz et al. |
| 10,892,246 | B2 | 1/2021 | Uzoh |
| 10,910,344 | B2 | 2/2021 | DeLaCruz et al. |
| 10,923,408 | B2 | 2/2021 | Huang et al. |
| 10,923,413 | B2 | 2/2021 | DeLaCruz |
| 10,950,547 | B2 | 3/2021 | Mohammed et al. |
| 10,964,664 | B2 | 3/2021 | Mandalapu et al. |
| 10,985,133 | B2 | 4/2021 | Uzoh |
| 10,991,804 | B2 | 4/2021 | DeLaCruz et al. |
| 10,998,292 | B2 | 5/2021 | Lee et al. |
| 11,004,757 | B2 | 5/2021 | Katkar et al. |
| 11,011,494 | B2 | 5/2021 | Gao et al. |
| 11,011,503 | B2 | 5/2021 | Wang et al. |
| 11,031,285 | B2 | 6/2021 | Katkar et al. |
| 11,037,919 | B2 | 6/2021 | Uzoh et al. |
| 11,056,348 | B2 | 7/2021 | Theil |
| 11,056,390 | B2 | 7/2021 | Uzoh et al. |
| 11,069,734 | B2 | 7/2021 | Katkar |
| 11,088,099 | B2 | 8/2021 | Katkar et al. |
| 11,127,738 | B2 | 9/2021 | DeLaCruz et al. |
| 11,145,626 | B2 | 10/2021 | Hwang et al. |
| 11,158,606 | B2 | 10/2021 | Gao et al. |
| 11,169,326 | B2 | 11/2021 | Huang et al. |
| 11,171,117 | B2 | 11/2021 | Gao et al. |
| 11,176,450 | B2 | 11/2021 | Teig et al. |
| 11,195,748 | B2 | 12/2021 | Uzoh et al. |
| 11,205,625 | B2 | 12/2021 | DeLaCruz et al. |
| 11,222,863 | B2 | 1/2022 | Hua et al. |
| 11,244,920 | B2 | 2/2022 | Uzoh |
| 11,256,004 | B2 | 2/2022 | Haba et al. |
| 11,264,357 | B1 | 3/2022 | DeLaCruz et al. |
| 11,276,676 | B2 | 3/2022 | Enquist et al. |
| 11,296,044 | B2 | 4/2022 | Gao et al. |
| 11,296,053 | B2 | 4/2022 | Uzoh et al. |
| 11,329,034 | B2 | 5/2022 | Tao et al. |
| 11,348,898 | B2 | 5/2022 | DeLaCruz et al. |
| 11,355,404 | B2 | 6/2022 | Gao et al. |
| 11,355,443 | B2 | 6/2022 | Huang et al. |
| 11,367,652 | B2 | 6/2022 | Uzoh et al. |
| 11,373,963 | B2 | 6/2022 | DeLaCruz et al. |
| 11,380,597 | B2 | 7/2022 | Katkar et al. |
| 11,385,278 | B2 | 7/2022 | DeLaCruz et al. |
| 11,387,202 | B2 | 7/2022 | Haba et al. |
| 11,387,214 | B2 | 7/2022 | Wang et al. |
| 11,393,779 | B2 | 7/2022 | Gao et al. |
| 11,437,423 | B2 | 9/2022 | Takachi |
| 11,462,419 | B2 | 10/2022 | Haba |
| 11,476,213 | B2 | 10/2022 | Haba et al. |
| 11,515,291 | B2 | 11/2022 | DeLaCruz et al. |
| 11,610,846 | B2 | 3/2023 | Haba et al. |
| 11,626,363 | B2 | 4/2023 | Haba et al. |
| 11,631,647 | B2 | 4/2023 | Haba |
| 11,664,357 | B2 | 5/2023 | Fountain, Jr. et al. |
| 11,721,653 | B2 | 8/2023 | DeLaCruz et al. |
| 11,728,273 | B2 | 8/2023 | Haba |
| 11,735,523 | B2 | 8/2023 | Uzoh |
| 11,742,314 | B2 | 8/2023 | Uzoh et al. |
| 11,749,645 | B2 | 9/2023 | Gao et al. |
| 11,762,200 | B2 | 9/2023 | Katkar et al. |
| 11,764,177 | B2 | 9/2023 | Haba |
| 11,842,894 | B2 | 12/2023 | Katkar et al. |
| 11,862,602 | B2 | 1/2024 | DeLaCruz et al. |
| 11,876,076 | B2 | 1/2024 | DeLaCruz et al. |
| 11,901,281 | B2 | 2/2024 | Haba et al. |
| 11,916,076 | B2 | 2/2024 | DeLaCruz et al. |
| 2002/0000328 | A1 | 1/2002 | Motomura et al. |
| 2002/0003307 | A1 | 1/2002 | Suga |
| 2002/0004288 | A1 | 1/2002 | Nishiyama |
| 2002/0074668 | A1 | 6/2002 | Hofstee et al. |
| 2004/0084414 | A1 | 5/2004 | Sakai et al. |
| 2004/0140546 | A1 | 7/2004 | Lee et al. |
| 2004/0188501 | A1 | 9/2004 | Tolchinsky et al. |
| 2004/0238927 | A1 | 12/2004 | Miyazawa |
| 2005/0040530 | A1 | 2/2005 | Shi |
| 2005/0153522 | A1 | 7/2005 | Hwang et al. |
| 2005/0218518 | A1 | 10/2005 | Jiang et al. |
| 2006/0057945 | A1 | 3/2006 | Hsu et al. |
| 2006/0087042 | A1 | 4/2006 | Kameyama et al. |
| 2006/0278331 | A1 | 12/2006 | Dugas et al. |
| 2007/0007639 | A1 | 1/2007 | Fukazawa et al. |
| 2007/0080442 | A1 | 4/2007 | Meyer-Berg |
| 2007/0096294 | A1 | 5/2007 | Ikeda et al. |
| 2007/0111386 | A1 | 5/2007 | Kim et al. |
| 2007/0158024 | A1 | 7/2007 | Addison et al. |
| 2007/0158827 | A1 | 7/2007 | Schuster |
| 2007/0222048 | A1 | 9/2007 | Huang |
| 2007/0295456 | A1 | 12/2007 | Gudeman et al. |
| 2008/0036082 | A1 | 2/2008 | Eun |
| 2008/0079105 | A1 | 4/2008 | Chang et al. |
| 2008/0231311 | A1 | 9/2008 | Condorelli et al. |
| 2008/0265421 | A1 | 10/2008 | Brunnbauer et al. |
| 2008/0308928 | A1 | 12/2008 | Chang |
| 2009/0032939 | A1 * | 2/2009 | Harper .................... H01L 24/11 257/E21.582 |
| 2009/0068831 | A1 | 3/2009 | Enquist et al. |
| 2009/0149023 | A1 | 6/2009 | Koyanagi |
| 2009/0227089 | A1 | 9/2009 | Plaut et al. |
| 2009/0252939 | A1 | 10/2009 | Park et al. |
| 2009/0283898 | A1 | 11/2009 | Janzen et al. |
| 2009/0321939 | A1 | 12/2009 | Chandrasekaran |
| 2010/0123268 | A1 | 5/2010 | Menard |
| 2010/0167534 | A1 | 7/2010 | Iwata |
| 2010/0327424 | A1 | 12/2010 | Braunisch et al. |
| 2011/0074033 | A1 | 3/2011 | Kaltalioglu et al. |
| 2011/0186977 | A1 | 8/2011 | Chi et al. |
| 2011/0290552 | A1 | 12/2011 | Palmateer et al. |
| 2012/0025396 | A1 | 2/2012 | Liao et al. |
| 2012/0049344 | A1 | 3/2012 | Pagaila et al. |

(56) References Cited

U.S. PATENT DOCUMENTS

| | | | |
|---|---|---|---|
| 2012/0074585 | A1 | 3/2012 | Koo et al. |
| 2012/0119360 | A1 | 5/2012 | Kim et al. |
| 2012/0187516 | A1 | 7/2012 | Sato |
| 2012/0194719 | A1 | 8/2012 | Churchwell et al. |
| 2012/0199960 | A1 | 8/2012 | Cosue et al. |
| 2012/0212384 | A1 | 8/2012 | Kam et al. |
| 2012/0217644 | A1 | 8/2012 | Pagaila |
| 2013/0009325 | A1 | 1/2013 | Mori |
| 2013/0037962 | A1 | 2/2013 | Xue |
| 2013/0082399 | A1 | 4/2013 | Kim et al. |
| 2013/0122655 | A1 | 5/2013 | Yu et al. |
| 2013/0265733 | A1 | 10/2013 | Herbsommer et al. |
| 2013/0299997 | A1 | 11/2013 | Sadaka |
| 2013/0334697 | A1 | 12/2013 | Shin et al. |
| 2014/0013606 | A1 | 1/2014 | Nah et al. |
| 2014/0154839 | A1 | 6/2014 | Ahn et al. |
| 2014/0175655 | A1 | 6/2014 | Chen et al. |
| 2014/0225795 | A1 | 8/2014 | Yu |
| 2014/0299981 | A1 | 10/2014 | Goh et al. |
| 2014/0312511 | A1 | 10/2014 | Nakamura |
| 2014/0327150 | A1 | 11/2014 | Jung et al. |
| 2014/0370658 | A1 | 12/2014 | Tong et al. |
| 2014/0377909 | A1 | 12/2014 | Chung et al. |
| 2015/0021754 | A1 | 1/2015 | Lin et al. |
| 2015/0048500 | A1 | 2/2015 | Yu et al. |
| 2015/0064498 | A1 | 3/2015 | Tong |
| 2015/0102468 | A1 | 4/2015 | Kang et al. |
| 2015/0130082 | A1 | 5/2015 | Lu et al. |
| 2015/0171050 | A1 | 6/2015 | Chen et al. |
| 2015/0179481 | A1 | 6/2015 | Lin |
| 2015/0194406 | A1 | 7/2015 | Teh et al. |
| 2015/0206865 | A1 | 7/2015 | Yu et al. |
| 2015/0235991 | A1 | 8/2015 | Gu et al. |
| 2015/0262845 | A1 | 9/2015 | Hwang et al. |
| 2015/0270209 | A1 | 9/2015 | Woychik et al. |
| 2015/0340285 | A1 | 11/2015 | Enquest et al. |
| 2016/0079209 | A1 | 3/2016 | Miyajima |
| 2016/0126634 | A1 | 5/2016 | Liu et al. |
| 2016/0163650 | A1 | 6/2016 | Gao et al. |
| 2016/0260684 | A1 | 9/2016 | Zhai et al. |
| 2016/0300813 | A1 | 10/2016 | Zhai et al. |
| 2016/0300817 | A1 | 10/2016 | Do et al. |
| 2016/0322330 | A1 | 11/2016 | Lin et al. |
| 2016/0329284 | A1 | 11/2016 | We et al. |
| 2016/0343682 | A1 | 11/2016 | Kawasaki |
| 2016/0343685 | A1 | 11/2016 | Lin et al. |
| 2016/0372323 | A1 | 12/2016 | Doub et al. |
| 2017/0023405 | A1 | 1/2017 | Fahim et al. |
| 2017/0062366 | A1 | 3/2017 | Enquist |
| 2017/0062383 | A1 | 3/2017 | Yee et al. |
| 2017/0125379 | A1 | 5/2017 | Chen et al. |
| 2017/0148764 | A1 | 5/2017 | Wang et al. |
| 2017/0179029 | A1 | 6/2017 | Enquist et al. |
| 2017/0179078 | A1 | 6/2017 | Jung et al. |
| 2017/0194271 | A1 | 7/2017 | Hsu et al. |
| 2017/0200711 | A1 | 7/2017 | Uzoh et al. |
| 2017/0338214 | A1 | 11/2017 | Uzoh et al. |
| 2017/0365580 | A1 | 12/2017 | Shih et al. |
| 2017/0365591 | A1 | 12/2017 | Chang et al. |
| 2018/0005984 | A1 | 1/2018 | Yu et al. |
| 2018/0005992 | A1 | 1/2018 | Yu et al. |
| 2018/0006006 | A1 | 1/2018 | Kim et al. |
| 2018/0012787 | A1 | 1/2018 | Oka et al. |
| 2018/0012868 | A1 | 1/2018 | Huang et al. |
| 2018/0026008 | A1 | 1/2018 | Jeng et al. |
| 2018/0053746 | A1 | 2/2018 | Yu et al. |
| 2018/0068958 | A1 | 3/2018 | Cho et al. |
| 2018/0096931 | A1 | 4/2018 | Huang et al. |
| 2018/0122774 | A1 | 5/2018 | Huang et al. |
| 2018/0130769 | A1 | 5/2018 | Tan et al. |
| 2018/0138101 | A1 | 5/2018 | Yu et al. |
| 2018/0174995 | A1 | 6/2018 | Wang et al. |
| 2018/0175012 | A1 | 6/2018 | Wu et al. |
| 2018/0182639 | A1 | 6/2018 | Uzoh et al. |
| 2018/0182666 | A1 | 6/2018 | Uzoh et al. |
| 2018/0190580 | A1 | 7/2018 | Haba et al. |
| 2018/0190583 | A1 | 7/2018 | DeLaCruz et al. |
| 2018/0191047 | A1 | 7/2018 | Huang et al. |
| 2018/0219038 | A1 | 8/2018 | Gambino et al. |
| 2018/0226375 | A1 | 8/2018 | Enquist et al. |
| 2018/0273377 | A1 | 9/2018 | Katkar et al. |
| 2018/0286805 | A1 | 10/2018 | Huang et al. |
| 2018/0323177 | A1 | 11/2018 | Yu et al. |
| 2018/0323227 | A1 | 11/2018 | Zhang et al. |
| 2018/0331066 | A1 | 11/2018 | Uzoh et al. |
| 2018/0366437 | A1 | 12/2018 | Chen et al. |
| 2018/0366442 | A1 | 12/2018 | Gu et al. |
| 2018/0366446 | A1 | 12/2018 | Haba et al. |
| 2019/0096741 | A1 | 3/2019 | Uzoh et al. |
| 2019/0096842 | A1 | 3/2019 | Fountain, Jr. et al. |
| 2019/0103409 | A1 | 4/2019 | Xu et al. |
| 2019/0115277 | A1 | 4/2019 | Yu et al. |
| 2019/0131277 | A1 | 5/2019 | Yang et al. |
| 2019/0198407 | A1 | 6/2019 | Huang et al. |
| 2019/0198409 | A1 | 6/2019 | Katkar et al. |
| 2019/0221548 | A1 | 7/2019 | Huang et al. |
| 2019/0265411 | A1 | 8/2019 | Huang et al. |
| 2019/0333550 | A1 | 10/2019 | Fisch |
| 2019/0333871 | A1 | 10/2019 | Chen et al. |
| 2019/0341306 | A1 | 11/2019 | Yu et al. |
| 2019/0348336 | A1 | 11/2019 | Katkar et al. |
| 2019/0355706 | A1 | 11/2019 | Enquist et al. |
| 2019/0371763 | A1 | 12/2019 | Agarwal et al. |
| 2019/0385935 | A1 | 12/2019 | Gao et al. |
| 2019/0385966 | A1* | 12/2019 | Gao .................. H01L 21/76898 |
| 2019/0385981 | A1 | 12/2019 | Chen et al. |
| 2020/0006309 | A1 | 1/2020 | Chen et al. |
| 2020/0013637 | A1 | 1/2020 | Haba |
| 2020/0013765 | A1 | 1/2020 | Fountain, Jr. et al. |
| 2020/0035641 | A1 | 1/2020 | Fountain, Jr. et al. |
| 2020/0058617 | A1 | 2/2020 | Wu et al. |
| 2020/0075520 | A1 | 3/2020 | Gao et al. |
| 2020/0075534 | A1 | 3/2020 | Gao et al. |
| 2020/0075553 | A1 | 3/2020 | DeLaCruz et al. |
| 2020/0118973 | A1 | 4/2020 | Wang et al. |
| 2020/0126906 | A1 | 4/2020 | Uzoh et al. |
| 2020/0135684 | A1 | 4/2020 | Kim et al. |
| 2020/0176419 | A1 | 6/2020 | Dabral et al. |
| 2020/0194396 | A1 | 6/2020 | Uzoh |
| 2020/0227367 | A1 | 7/2020 | Haba et al. |
| 2020/0243380 | A1 | 7/2020 | Uzoh et al. |
| 2020/0279821 | A1 | 9/2020 | Haba et al. |
| 2020/0294908 | A1 | 9/2020 | Haba et al. |
| 2020/0294920 | A1 | 9/2020 | Hariri et al. |
| 2020/0328162 | A1 | 10/2020 | Haba et al. |
| 2020/0328164 | A1 | 10/2020 | DeLaCruz et al. |
| 2020/0328165 | A1 | 10/2020 | DeLaCruz et al. |
| 2020/0335408 | A1 | 10/2020 | Gao et al. |
| 2020/0371154 | A1 | 11/2020 | DeLaCruz et al. |
| 2020/0395300 | A1 | 12/2020 | Xie et al. |
| 2020/0395321 | A1 | 12/2020 | Katkar et al. |
| 2020/0403006 | A1 | 12/2020 | DeLaCruz et al. |
| 2020/0411483 | A1 | 12/2020 | Uzoh et al. |
| 2021/0020577 | A1 | 1/2021 | Hu |
| 2021/0028080 | A1 | 1/2021 | Pietambaram et al. |
| 2021/0057352 | A1 | 2/2021 | Agarwal et al. |
| 2021/0066219 | A1 | 3/2021 | Chen et al. |
| 2021/0082797 | A1 | 3/2021 | Lee et al. |
| 2021/0082822 | A1 | 3/2021 | Aleksov et al. |
| 2021/0082825 | A1 | 3/2021 | Strong et al. |
| 2021/0098412 | A1 | 4/2021 | Haba et al. |
| 2021/0098421 | A1 | 4/2021 | Wu et al. |
| 2021/0111125 | A1 | 4/2021 | Chen et al. |
| 2021/0118864 | A1 | 4/2021 | DeLaCruz et al. |
| 2021/0125933 | A1 | 4/2021 | Chen et al. |
| 2021/0125965 | A1 | 4/2021 | Lu |
| 2021/0134724 | A1 | 5/2021 | Rubin et al. |
| 2021/0143125 | A1 | 5/2021 | DeLaCruz et al. |
| 2021/0181510 | A1 | 6/2021 | Katkar et al. |
| 2021/0183847 | A1 | 6/2021 | Uzoh et al. |
| 2021/0193603 | A1 | 6/2021 | Katkar et al. |
| 2021/0193624 | A1 | 6/2021 | DeLaCruz et al. |
| 2021/0193625 | A1 | 6/2021 | DeLaCruz et al. |
| 2021/0202396 | A1 | 7/2021 | Wu et al. |

(56) References Cited

U.S. PATENT DOCUMENTS

| | | | |
|---|---|---|---|
| 2021/0225780 | A1 | 7/2021 | Wu et al. |
| 2021/0242152 | A1 | 8/2021 | Fountain, Jr. et al. |
| 2021/0280507 | A1 | 9/2021 | Aldrete et al. |
| 2021/0280517 | A1 | 9/2021 | May et al. |
| 2021/0280522 | A1 | 9/2021 | Liu |
| 2021/0296282 | A1 | 9/2021 | Gao et al. |
| 2021/0305122 | A1 | 9/2021 | Lai et al. |
| 2021/0305202 | A1 | 9/2021 | Uzoh et al. |
| 2021/0335726 | A1 | 10/2021 | Wu et al. |
| 2021/0366820 | A1 | 11/2021 | Uzoh |
| 2021/0366970 | A1 | 11/2021 | Katkar |
| 2021/0375708 | A1 | 12/2021 | Kuo et al. |
| 2021/0375737 | A1 | 12/2021 | Lin |
| 2021/0384133 | A1 | 12/2021 | Ong et al. |
| 2021/0384135 | A1 | 12/2021 | Kuan et al. |
| 2021/0391271 | A1 | 12/2021 | Hsu et al. |
| 2021/0391272 | A1 | 12/2021 | Tsai et al. |
| 2021/0391283 | A1 | 12/2021 | Hsu et al. |
| 2021/0391284 | A1 | 12/2021 | Hsu et al. |
| 2021/0391376 | A1 * | 12/2021 | Chen .................. H01L 23/5385 |
| 2021/0407941 | A1 | 12/2021 | Haba |
| 2022/0005787 | A1 | 1/2022 | Han et al. |
| 2022/0077063 | A1 | 3/2022 | Haba |
| 2022/0077087 | A1 | 3/2022 | Haba |
| 2022/0122934 | A1 | 4/2022 | Haba |
| 2022/0139867 | A1 | 5/2022 | Uzoh |
| 2022/0139869 | A1 | 5/2022 | Gao et al. |
| 2022/0189941 | A1 | 6/2022 | Enquist et al. |
| 2022/0208650 | A1 | 6/2022 | Gao et al. |
| 2022/0208702 | A1 | 6/2022 | Uzoh |
| 2022/0208723 | A1 | 6/2022 | Katkar et al. |
| 2022/0246497 | A1 | 8/2022 | Fountain, Jr. et al. |
| 2022/0278084 | A1 | 9/2022 | Ong et al. |
| 2022/0285303 | A1 | 9/2022 | Mirkarimi et al. |
| 2022/0293567 | A1 | 9/2022 | Uzoh et al. |
| 2022/0319901 | A1 | 10/2022 | Suwito et al. |
| 2022/0320035 | A1 | 10/2022 | Uzoh et al. |
| 2022/0320036 | A1 | 10/2022 | Gao et al. |
| 2023/0019869 | A1 | 1/2023 | Mirkarimi et al. |
| 2023/0036441 | A1 | 2/2023 | Haba et al. |
| 2023/0067677 | A1 | 3/2023 | Lee et al. |
| 2023/0069183 | A1 | 3/2023 | Haba |
| 2023/0100032 | A1 | 3/2023 | Haba et al. |
| 2023/0115122 | A1 | 4/2023 | Uzoh et al. |
| 2023/0122531 | A1 | 4/2023 | Uzoh |
| 2023/0123423 | A1 | 4/2023 | Gao et al. |
| 2023/0125395 | A1 | 4/2023 | Gao et al. |
| 2023/0130259 | A1 | 4/2023 | Haba et al. |
| 2023/0132632 | A1 | 5/2023 | Katkar et al. |
| 2023/0140107 | A1 | 5/2023 | Uzoh et al. |
| 2023/0142680 | A1 | 5/2023 | Guevara et al. |
| 2023/0154816 | A1 | 5/2023 | Haba et al. |
| 2023/0154828 | A1 | 5/2023 | Haba et al. |
| 2023/0187264 | A1 | 6/2023 | Uzoh et al. |
| 2023/0187317 | A1 | 6/2023 | Uzoh |
| 2023/0187412 | A1 | 6/2023 | Gao et al. |
| 2023/0197453 | A1 | 6/2023 | Fountain, Jr. et al. |
| 2023/0197496 | A1 | 6/2023 | Theil |
| 2023/0197559 | A1 | 6/2023 | Haba et al. |
| 2023/0197560 | A1 | 6/2023 | Katkar et al. |
| 2023/0197655 | A1 | 6/2023 | Theil et al. |
| 2023/0207402 | A1 | 6/2023 | Fountain, Jr. et al. |
| 2023/0207437 | A1 | 6/2023 | Haba |
| 2023/0207474 | A1 | 6/2023 | Uzoh et al. |
| 2023/0207514 | A1 | 6/2023 | Gao et al. |
| 2023/0215836 | A1 | 7/2023 | Haba et al. |
| 2023/0245950 | A1 | 8/2023 | Haba et al. |
| 2023/0268300 | A1 | 8/2023 | Uzoh et al. |
| 2023/0299029 | A1 | 9/2023 | Theil et al. |
| 2023/0343734 | A1 | 10/2023 | Uzoh et al. |
| 2023/0360950 | A1 | 11/2023 | Gao |
| 2023/0361074 | A1 | 11/2023 | Uzoh et al. |
| 2023/0369136 | A1 | 11/2023 | Uzoh et al. |
| 2023/0375613 | A1 | 11/2023 | Haba et al. |
| 2024/0038702 | A1 | 2/2024 | Uzoh |
| 2024/0055407 | A1 | 2/2024 | Workman |
| 2024/0079376 | A1 | 3/2024 | Suwito et al. |
| 2024/0105674 | A1 | 3/2024 | Uzoh et al. |
| 2024/0170411 | A1 | 5/2024 | Chang et al. |
| 2024/0186248 | A1 | 6/2024 | Haba et al. |
| 2024/0186268 | A1 | 6/2024 | Uzoh et al. |
| 2024/0186269 | A1 | 6/2024 | Haba |
| 2024/0203917 | A1 | 6/2024 | Katkar et al. |
| 2024/0213191 | A1 | 6/2024 | Theil et al. |
| 2024/0213210 | A1 | 6/2024 | Haba et al. |
| 2024/0217210 | A1 | 7/2024 | Zhao et al. |
| 2024/0222239 | A1 | 7/2024 | Gao et al. |
| 2024/0222315 | A1 | 7/2024 | Uzoh |
| 2024/0222319 | A1 | 7/2024 | Gao et al. |
| 2024/0266255 | A1 | 8/2024 | Haba et al. |
| 2024/0298454 | A1 | 9/2024 | Haba |
| 2024/0304593 | A1 | 9/2024 | Uzoh |
| 2024/0312951 | A1 | 9/2024 | Theil et al. |
| 2024/0332184 | A1 | 10/2024 | Katkar et al. |
| 2024/0332227 | A1 | 10/2024 | Uzoh et al. |
| 2024/0332231 | A1 | 10/2024 | Uzoh |
| 2024/0332267 | A1 | 10/2024 | Haba et al. |
| 2024/0387419 | A1 | 11/2024 | Mrozek et al. |
| 2025/0004197 | A1 | 1/2025 | Haba et al. |
| 2025/0006632 | A1 | 1/2025 | Chang et al. |
| 2025/0006642 | A1 | 1/2025 | Haba et al. |
| 2025/0006674 | A1 | 1/2025 | Uzoh et al. |
| 2025/0006679 | A1 | 1/2025 | Theil et al. |
| 2025/0006689 | A1 | 1/2025 | Uzoh et al. |
| 2025/0054854 | A1 | 2/2025 | Katkar et al. |
| 2025/0079364 | A1 | 3/2025 | Uzoh et al. |
| 2025/0096191 | A1 | 3/2025 | Gao et al. |
| 2025/0112123 | A1 | 4/2025 | Katkar et al. |
| 2025/0185163 | A1 | 6/2025 | Zhao et al. |

FOREIGN PATENT DOCUMENTS

| | | | |
|---|---|---|---|
| EP | 2 685 491 | A2 | 1/2014 |
| JP | 04-337694 | | 11/1992 |
| JP | 2000-100679 | | 4/2000 |
| JP | 2001-102479 | | 4/2001 |
| JP | 2001-284520 | | 10/2001 |
| JP | 2002-353416 | | 12/2002 |
| JP | 2002-359345 | | 12/2002 |
| JP | 2004-193493 | | 7/2004 |
| JP | WO 2014/196105 | | 12/2004 |
| JP | 2008-130603 | A | 6/2008 |
| JP | 2011-171614 | | 9/2011 |
| JP | 2013-33786 | | 2/2013 |
| JP | 2018-528622 | A | 9/2018 |
| JP | 2018-160519 | | 10/2018 |
| JP | 2018-200958 | A | 12/2018 |
| JP | 2019-047043 | A | 3/2019 |
| KR | 10-2001-0104643 | | 11/2001 |
| KR | 10-2010-0123755 | | 11/2010 |
| KR | 10-2015-0097798 | | 8/2015 |
| WO | WO 2005/043584 | A2 | 5/2005 |
| WO | WO 2006/100444 | A1 | 9/2006 |
| WO | WO 2008/112101 | A2 | 9/2008 |
| WO | WO 2010/024678 | A1 | 3/2010 |
| WO | WO 2012/004964 | A1 | 1/2012 |
| WO | WO 2017/034654 | A1 | 3/2017 |
| WO | WO 2017/035321 | | 3/2017 |
| WO | WO 2017/052652 | A1 | 3/2017 |
| WO | WO 2017/151442 | A1 | 9/2017 |

OTHER PUBLICATIONS

Braunisch, H. et al., "High-speed performance of silicon bridge die-to-die interconnects," 2011 IEEE, pp. 95-98.

Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding

(56) References Cited

OTHER PUBLICATIONS method," Applied Surface Science, Jun. 2, 1997, vols. 117-118, pp. 808-812.
Farrens et al., "Chemical free room temperature wafer to wafer direct bonding," J. Electrochem. Soc., The Electrochemical Society, Inc., Nov. 1995, vol. 142, No. 11. pp. 3949-3955.
Farrens et al., "Chemical free wafer bonding of silicon to glass and sapphire," Electrochemical Society Proceedings vol. 95-7, 1995, pp. 72-77.
Frumusanu, Andrei, "TSMC's version of EMIB is 'LSI': Currently in pre-qualification," AnaandTech, https://www.anandtech.com/show/16031/tsmcs-version-of-emib-lsi-3dfabric, Aug. 25, 2020, 6 pages.
Fukushima, T. et al., "New three-dimensional integration technology using self-assembly technique," International Electron Devices Meeting 5-7.12.2005, IEEE, Dec. 5, 2005, pp. 348-351.
Gösele et al., "Semiconductor Wafer Bonding: A flexible approach to materials combinations in microelectronics; micromechanics and optoelectronics," IEEE, 1997, pp. 23-32.
Hosoda et al., "Effect of the surface treatment on the room-temperature bonding of Al to Si and SiO2," Journal of Materials Science, Jan. 1, 1998, vol. 33, Issue 1, pp. 253-258.
Hosoda et al., "Room temperature GaAs—Si and InP—Si wafer direct bonding by the surface activated bonding method," Nuclear Inst. And Methods in Physics Research B, 1997, vol. 121, Nos. 1-4, pp. 203-206.
Howlader et al., "A novel method for bonding of ionic wafers," Electronics Components and Technology Conference, 2006, IEEE, pp. 7-pp.
Howlader et al., "Bonding of p-Si/n-InP wafers through surface activated bonding method at room temperature," Indium Phosphide and Related Materials, 2001, IEEE International Conference On, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
International Search Report and Written Opinion mailed Apr. 22, 2019 in International Application No. PCT/US2018/064982, 13 pages.
International Search Report and Written Opinion mailed Oct. 25, 2019, issued in International Application No. PCT/US2019/040622, 12 pages.
International Search Report and Written Opinion mailed Oct. 28, 2022, issued in International Application No. PCT/US2022/035559, 10 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—CU, Cu—Si, and Cu—SiO2 at low temperature," Proceedings—Electrochemical Society, 2003, vol. 19, pp. 239-247.
Matsuzawa et al., "Room-temperature interconnection of electroplated Au microbump by means of surface activated bonding method," Electornic Components and Technology Confererence, 2001, 51st Proceedings, IEEE, pp. 384-387.
Moriceau, H. et al., "Overview of recent direct wafer bonding advances and applications," Advances in Natural Sciences—Nanoscience and Nanotechnology, 2010, 11 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
NASA SBIR/STTR Technologies, Proposal No. 09-1 S5.05-9060—Reliable Direct Bond Copper Ceramic Packages for High Temperature Power Electronics, Contract No. NNX10CE23P, PI: Ender Savrun, PhD, Sienna Technologies, Inc.—Woodinville, WA, 1 page.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(I), 6 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
"Photo Etching DBC for Power Circuits—Direct Bond Copper (DBC) on Ceramic Used for Power Circuits," Conard Corporation, 2021, downloaded Nov. 9, 2021, https://www.conardcorp.com/photo-etching-dbc-for-power-circuits/, 2 pages.
Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviouir," Electrochemical Society Proceedings, 1998, vol. 97-36, pp. 437-444.
Roberds et al., "Low temperature , in situ, plasma activated wafer bonding," Electrochecmical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.

(56) References Cited

OTHER PUBLICATIONS

Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room-temperature bonding of lithium niobate and silicon wafers by argon-beam surface activation," Appl. Phys. Lett., 1999. vol. 74, pp. 2387.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al., "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.
Topol et al., "Enabling technologies for wafer-level bonding of 3D MEMS and integrated circuit structures," 2004 Electronics Components and Technology Conference, 2004 IEEE, pp. 931-938.
Uhrmann, T. et al., "Heterogeneous integration by collective die-to-wafer bonding," Chip Scale Review, Nov./Dec. 2018, vol. 22, No. 6, pp. 10-12.
Urteaga, M. et al., "THz bandwidth InP HBT technologies and heterogeneous integration with Si CMOS," 2016 IEEE Bipolar/BiCMOS Circuits and Technology Meeting (BCTM), 2016, pp. 35-41, doi: 10.1109/BCTM.2016.7738973.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Xu et al., "New Au—Al interconnect technology and its reliability by surface activated bonding," Electronic Packaging Technology Proceedings, Oct. 28-30, 2003, Shanghai, China, pp. 479-483.
Ceramic Microstructures: Control at the Atomic Level, Recent Progress in Surface Activated Bonding, 1998, pp. 385-389.
Bush, Steve, "Electronica: Automotive power modules from On Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).
Fowler et al., "Novel photosensitive permanent bonding material designed for polymer/metal hybrid bonding applications." In CS Mantech Conference May 9-23, 2022; 5 pages.
Huang et al., "Wafer-level polymer/metal hybrid bonding using a photosensitive permanent bonding material". Chip Scale Review. 2022;26(2): 49-53.
Khan et al., "Technologies for printing sensors and electronics over large flexible substrates," IEEE Sensors Journal, Jun. 2015, vol. 15, No. 6, pp. 3164-3185.
Michailos, Jean, "Future landscape for 3D Integration: from Interposers to 3D High Density," 3d ASIP—Dec. 13-15, 2016, San Francisco Airport, USA, 46 pages.
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
Onsemi AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, Electronics Weekly.com ("BUSH article"); however, the imaged part and the part shown in the BUSH article share the part number "Onsemi AR0820.".
Sony IMX260 images, showing various cross sections and materials analyses for a hybrid bonded back side illuminated CMOS image sensor. The part in the images was shipped in Apr. 2016. Applicant makes no representation that the part in the images is identical to the part identified inthe separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image." (8 pages).
European Extended Search Report dated Apr. 29, 2025 issued in Application No. 22834162.4, 7 pages.

* cited by examiner

Layout parameters

| a contact pad diameter | a contact pad pitch | a contact pad to contact pad space | a maximum routing trace width | a contact pad to routing trace space | a ratio of contact pad to contact pad space to contact pad to routing space | a via diameter |
|---|---|---|---|---|---|---|
| 15 | 40 | 25 | 5 | 10 | 2.50 | 5 |
| 15 | 30 | 15 | 3 | 6 | 2.50 | 3 |
| 10 | 40 | 30 | 5 | 12.5 | 2.40 | 5 |
| 10 | 30 | 20 | 3 | 8.5 | 2.35 | 3 |
| 10 | 20 | 10 | 2 | 4 | 2.50 | 2 |
| 5 | 30 | 35 | 3 | 11 | 2.27 | 3 |
| 5 | 20 | 15 | 2 | 6.5 | 2.31 | 2 |
| 5 | 10 | 5 | 1 | 2 | 2.50 | 1 |
| 2 | 10 | 8 | 1 | 3.5 | 2.29 | 1 |
| 2 | 6 | 4 | 0.5 | 1.75 | 2.29 | 0.5 |
| 2 | 4 | 2 | 0.3 | 0.85 | 2.35 | 0.3 |
| | | | | | Ratio less than 2.5 to 1 | |

All units in microns

ELEMENT WITH ROUTING STRUCTURE IN BONDING LAYER

CROSS-REFERENCE TO RELATED APPLICATIONS

This application claims priority to U.S. Provisional Patent Application No. 63/217,046, filed Jun. 30, 2021, titled "ELEMENT WITH ROUTING STRUCTURE IN BONDING LAYER," the entire contents of each of which are hereby incorporated herein by reference.

BACKGROUND

Field

The field generally relates to bonding layers, and in particular, to direct bonding layers with a routing structure for a semiconductor element.

Description of the Related Art

Integrated device packages can use a redistribution layer (RDL) to redistribute or route electrical connections (e.g., signals, ground or power) from one or more integrated device dies in the package to other devices. For example, fan-out redistribution can convey signals from finely-pitched bond pads of an integrated device die outwardly for greater spacing. Fan-in redistribution can re-route from peripheral die pads to more centrally located RDL pads. Lines and pads can be formed of a conductive material (e.g., metal) and covered with a non-conductive material (an insulator), and openings in the insulator over pads can be filled, for example, with solder, metal bumps or pillars for connection to other elements.

Another technique for connecting separate electronic elements, such as dies, is direct hybrid bonding, whereby both conductive and non-conductive features of an electronic element are directly bonded to the conductive and non-conductive features, respectively of another electronic element. Bonding layers can be provided with both conductive and non-conductive features. In some cases, RDL can serve as the bonding layer for direct hybrid bonding. For example, a metal layer can be deposited and patterned on a die to serve as routing lines away from the die pads. An insulator is deposited over the lines and patterned with openings in which pads are formed from another metal layer, such as by damascene techniques. The pads are exposed at the top, while the routing lines are buried under the insulator. To achieve the planarity desired for direct bonding, the insulator and pads are finely polished and prepared for direct bonding to a different element.

There remains a continuing need for improved structures and methods for connecting an element that includes an electronic component to another element.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternatively, other implementations of devices and/or systems may include additional components, or various combinations of the described components, and remain within the scope of the disclosure.

FIG. 1A is a schematic cross sectional side view of a first element and a second element prior to.

DETAILED DESCRIPTION

Two or more semiconductor elements (such as integrated device dies, wafers, etc.) may be bonded to one another to form a bonded structure. Conductive features (e.g., contact pads, exposed ends of vias (e.g., TSVs), or a through substrate electrodes) of one element may be electrically connected to corresponding conductive features of another element. Any suitable number of elements can be stacked in the bonded structure.

Figure 1A:
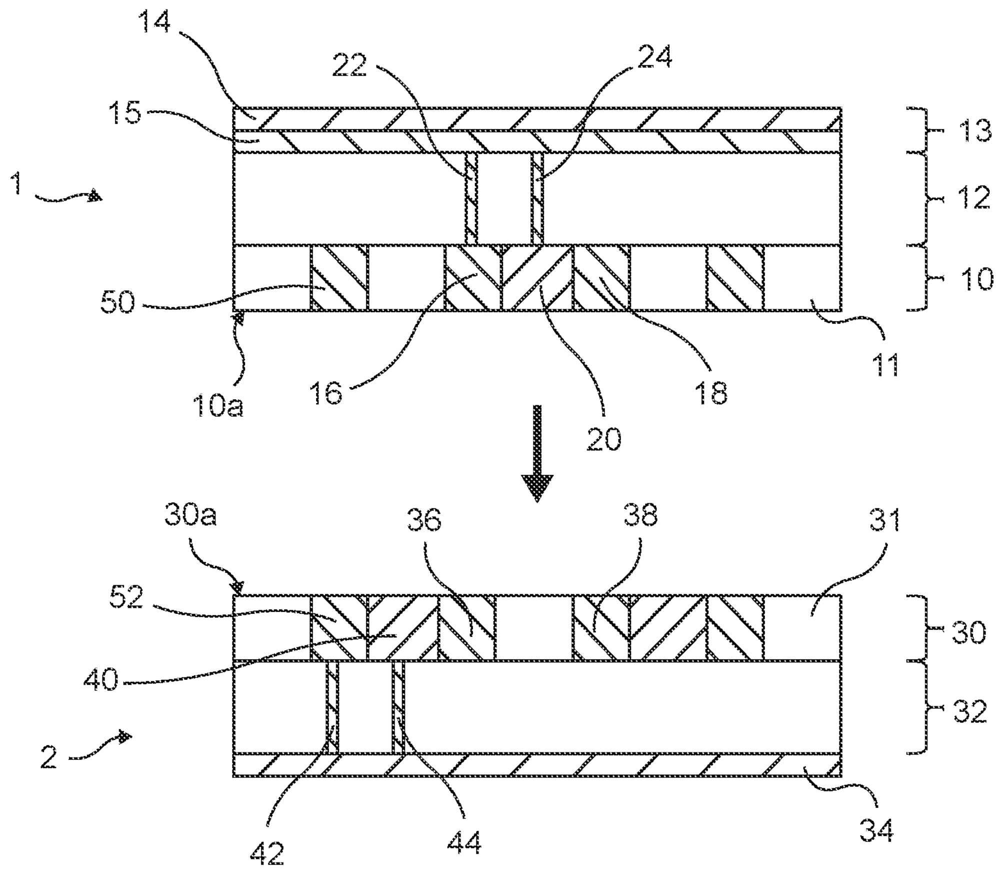
Figure 1B:
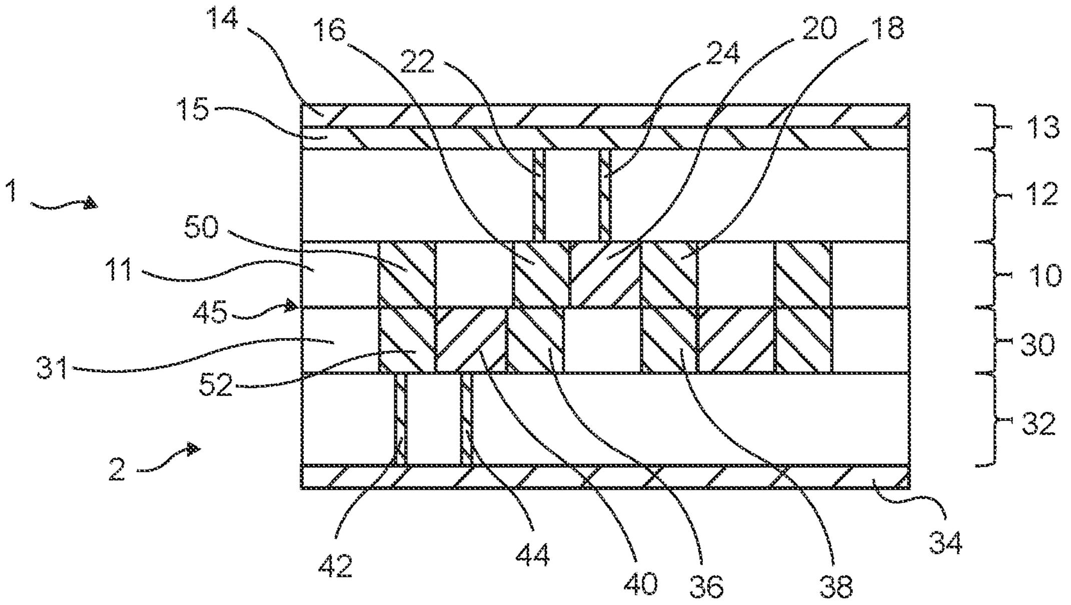
FIG. 1B is a schematic cross sectional side view of a bonded structure that includes the first element and the second element.

Referring to FIGS. 1A and 1B, in some embodiments, the elements (e.g., a first element 1 and the second element 2) are directly bonded to one another without an intervening adhesive. Instead, a redistribution layer (RDL) of one element is directly hybrid bonded to a redistribution layer of another element. In various embodiments, a non-conductive material 11 of the first element 1 (e.g., a first semiconductor device die with active circuitry or a first integrated device die) can be directly bonded to a corresponding a non-conductive material 31 of the second element 2 (e.g., a second semiconductor device die with active circuitry or an interconnect structure) without an adhesive. The non-conductive material 11 can be referred to as a non-conductive bonding region of the first element. The non-conductive material 11 of the first element 1 can be directly bonded to the corresponding non-conductive material 31 of the second element 2 using dielectric-to-dielectric bonding techniques. For example, dielectric-to-dielectric covalent bonds may be formed without an adhesive using the direct bonding techniques. Suitable non-conductive bonding materials include conventional insulating materials used in semiconductive processing including but not limited to silicon oxide, silicon nitride, silicon oxynitride, silicon carbide, silicon carbonitride, etc.

In various embodiments, direct bonds can be formed without an intervening adhesive. For example, dielectric bonding surfaces can be polished to a high degree of smoothness. The bonding surfaces can be cleaned and exposed to a plasma and/or etchants to activate the surfaces. In some embodiments, the surfaces can be terminated with a species after activation or during activation (e.g., during the plasma and/or etch processes). Without being limited by theory, in some embodiments, the activation process can be performed to break chemical bonds at the bonding surface, and the termination process can provide additional chemical species at the bonding surface that improves the bonding energy during direct bonding. In some embodiments, the activation and termination are provided in the same step, e.g., a plasma or wet etchant to activate and terminate the surfaces. In other embodiments, the bonding surface can be terminated in a separate treatment to provide the additional species for direct bonding. In various embodiments, the terminating species can comprise nitrogen. Further, in some embodiments, the bonding surfaces can be exposed to fluorine. For example, there may be one or multiple fluorine peaks at or near layer and/or bonding interfaces. Thus, in the directly bonded structures, the bonding interface between two dielectric materials can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive features (e.g., first and second contact pads 16, 18 shown in FIGS. 1A and 1B) of the first element 1 can be directly bonded to corresponding conductive features (e.g., third and fourth contact pads 36, 38 shown in FIGS. 1A and 1B) of the second element 2. For example, a hybrid bonding technique can be used to provide conductor-to-conductor direct bonds along a bond interface that includes covalently direct bonded dielectric-to-dielectric surfaces, prepared as described above. In various embodiments, the conductor-to-conductor (e.g., contact pad to contact pad) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes.

For example, dielectric bonding surfaces can be prepared and directly bonded to one another without an intervening adhesive as explained above. Conductive contact pads (which may be at least partially surrounded by non-conductive dielectric field regions) may also directly bond to one another without an intervening adhesive. In some embodiments, the respective conductive features can be recessed below exterior (e.g., upper) surfaces of the dielectric field or non-conductive bonding regions, for example, recessed by less than 20 nm, less than 15 nm, or less than 10 nm, for example, recessed in a range of 2 nm to 20 nm, or in a range of 4 nm to 10 nm. The non-conductive bonding regions can be directly bonded to one another without an adhesive at room temperature in some embodiments and, subsequently, the bonded structure can be annealed. Upon annealing, the conductive features can expand and contact one another to form a metal-to-metal direct bond. Beneficially, the use of hybrid direct bonding (e.g., DBI®, commercially available from Invensas Bonding Technologies, Inc. of San Jose, CA) techniques can enable high density of conductive features connected across the direct bond interface (e.g., small or fine pitches for regular arrays). In some embodiments, the pitch of the conductive features may be less 40 microns or less than 10 microns or even less than 1 micron. For some applications the ratio of the pitch of the conductive features to one of the dimensions of the bonding pad is less than 5, or less than 3 and sometimes desirably less than 2. In various embodiments, the conductive features can comprise copper, although other metals may be suitable.

Thus, in direct bonding processes, a first element can be directly bonded to a second element without an intervening adhesive. In some arrangements, the first element can comprise a singulated element, such as a singulated integrated device die. In other arrangements, the first element can comprise a carrier or substrate (e.g., a wafer) that includes a plurality (e.g., tens, hundreds, or more) of device regions that, when singulated, form a plurality of integrated device dies. Similarly, the second element can comprise a singulated element, such as a singulated integrated device die. In other arrangements, the second element can comprise a carrier or substrate (e.g., a wafer).

As explained herein, the first and second elements can be directly bonded to one another without an adhesive, which is different from a deposition process. The first and second elements can accordingly comprise non-deposited elements. A skilled artisan can visibly identify and distinguish the directly bonded elements and a layer that is deposited on an element. Further, directly bonded structures, unlike deposited layers, can include a defect region along the bond interface in which nanovoids are present. The nanovoids may be formed due to activation of the bonding surfaces (e.g., exposure to a plasma). As explained above, the bond interface can include concentration of materials from the activation and/or last chemical treatment processes. For example, in embodiments that utilize a nitrogen plasma for activation, a nitrogen peak can be formed at the bond interface. In embodiments that utilize an oxygen plasma for activation, an oxygen peak can be formed at the bond interface. The nitrogen peak can be detectable using secondary ion mass spectroscopy (SIMS) techniques. In various embodiments, for example, a nitrogen termination treatment (e.g., exposing the bonding surface to a nitrogen-containing plasma) can replace OH groups of a hydrolized (OH-terminated) surface with $NH_2$ molecules, yielding a nitrogen-terminated surface. In embodiments that utilize an oxygen plasma for activation, an oxygen peak can be formed at the bond interface. In some embodiments, the bond interface can comprise silicon oxynitride, silicon oxycarbonitride, or silicon carbonitride. As explained herein, the direct bond can comprise a covalent bond, which is stronger than van Der Waals bonds. The bonding layers can also comprise polished surfaces that are planarized to a high degree of smoothness.

In various embodiments, the metal-to-metal bonds between the conductive features can be joined such that copper grains grow into each other across the bond interface. In some embodiments, the copper can have grains oriented along the 111 crystal plane for improved copper diffusion across the bond interface. The bond interface can extend substantially entirely to at least a portion of the bonded conductive features, such that there is substantially no gap between the non-conductive bonding regions at or near the bonded conductive features. In some embodiments, a barrier layer may be provided under the conductive features (e.g., which may include copper). In other embodiments, however, there may be no barrier layer under the conductive features, for example, as described in U.S. Pat. No. 11,195,748, which is incorporated by reference herein in its entirety and for all purposes.

FIG. 1A is a schematic cross sectional side view of the first element 1 and the second element 2 prior to bonding the first element 1 with the second element 2. FIG. 1B is a schematic cross sectional side view of a bonded structure 3 that includes the first element 1 and the second element 2. The first element 1 can comprise a first bonding layer 10, a first via layer 12, and a routing structure 13. In some embodiments, the routing structure 13 can have a plurality of layers. For example, the routing structure 13 can include an active layer 14 and a routing layer 15 and one or more via layers between a plurality of routing layers. In some embodiments, the routing structure 13 can include a probe pad (not shown) that can be used to test a semiconductor circuit of the first element 1. The first bonding layer 10 can comprise a non-conductive material 11, and conductive features (a first contact pad 16, a second contact pad 18, and a first routing trace 20). The routing trace 20 can be formed at the same level as the first contact pad 16 and the second contact pad 18 within the bonding layer 10. A first via layer 12 can comprise a first via 22 and a second via 24. The first contact pad 16, the second contact pad 18, and the first routing trace 20 can comprise the same material. In some embodiments, the first contact pad 16, the second contact pad 18, and the first routing trace 20 can be simultaneously formed in a single manufacturing sequence, including a single patterning process. For example, the first contact pad 16, the second contact pad 18, and the first routing trace 20 can be formed in a single damascene process using a single mask to pattern and etch voids in the non-conductive material 11 to be filled with the conductive material for pads 16, 18 and first routing trace 20. In other examples, a single mask can be used to first pattern conductive layer to form pads 16, 18 and first routing trace 20, and the non-conductive material 11 can be subsequently formed thereover to embed the conductive features. The mask process can pattern etch a blanket conductive layer; the mask process can be used to form a lift-off mask pattern prior to conductive material deposition; or a shadow mask can be employed to deposit the conductive material to form the pads 16, 18 and first routing trace 20. In another embodiment, the first contact pad 16, the second contact pad 18, and the first routing trace 20 can be formed in a single damascene process.

A bonding surface 10*a* of the first element 1 is highly polished in preparation for direct bonding. In some embodiments, the roughness of the non-conductive material 11 is less than 15 Å rms. In some embodiments, the roughness of the non-conductive material 11 is less than 10 Å rms. In some embodiments, the roughness of the non-conductive material 11 is less than 5 Å rms. The non-conductive material 11 can also include signatures of activation and/or termination for direct bonding, such as fluorine and nitrogen profiles, as described above.

In some embodiments, the first contact pad 16, the second contact pad 18, and the first routing trace 20 can be exposed at the bonding surface 10*a* of the first bonding layer 10. In some embodiments, the non-conductive material 11, the first contact pad 16, the second contact pad 18, and the first routing trace 20 can be approximately coplanar with each other at the bonding surface 10*a* as the result of planarization (e.g., CMP). For example, an upper surface of the non-conductive material 11, an upper surface of the first contact pad 16, an upper surface the second contact pad 18, and an upper surface the first routing trace 20 can be coplanar with one another such that the upper surfaces the first contact pad 16, the second contact pad 18, and the first routing trace 20 are recessed from the upper surface of the non-conductive material 11 less than or equal to 50 nm, 30 nm, or 20 nm. In some embodiments, the first contact pad 16, the second contact pad 18, and/or the first routing trace 20 can have thicknesses that are approximately equal to or generally similar to a thickness of the bonding layer 10. The thickness of the first contact pad 16 and/or the second contact pad 18 can define the thickness of the bonding layer 10. For example, the first contact pad 16, the second contact pad 18, and/or the first routing trace 20 can extend through a thickness of the non-conductive material 11 of the first bonding layer 10 and be coplanar with one another at a bottom surface adjacent the illustrated first via layer 12. In some embodiments, a portion of the non-conductive material 11 can be disposed between the first via layer 12 and the first contact pad 16, the second contact pad 18, or the routing trace 20. In another embodiment, the first contact pad 16, the second contact pad 18, and/or the first routing trace 20 can have different thicknesses. For example, the first contact pad 16, the second contact pad 18 can have thicknesses that are approximately equal to or generally similar to a thickness of the bonding layer 10, but the first routing trace 20 can have a thickness that is smaller than the thickness of the bonding layer 10.

The surfaces of the conductive features (e.g., the first contact pad 16, the second contact pad 18, and the first routing trace 20) at the bonding surface 10*a* can vary slightly from flush with the non-conductive material 11 for a few reasons. In the first place, the conductive features may be intentionally recessed relative to the non-conductive surface in a planarization process, typically by between about 1 nm and 20 nm, in order to prepare for hybrid direct bonding. Furthermore, because the first routing trace 20 can be narrower than the contact pads 38, it may be subject to differential dishing relative to the wider conductive features.

Figure 3B:
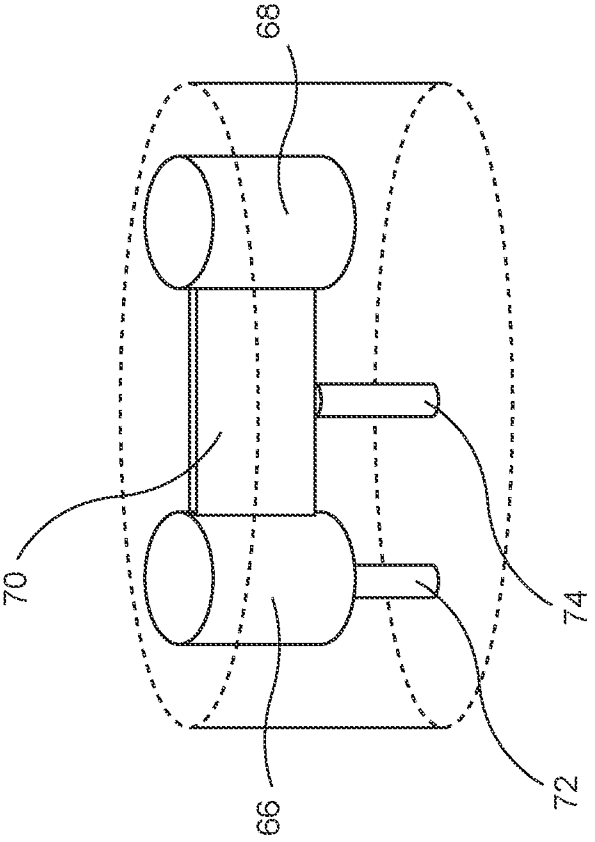
FIG. 3B is a schematic perspective view of the portion of the element illustrated in FIG. 3A.
Figure 3A:
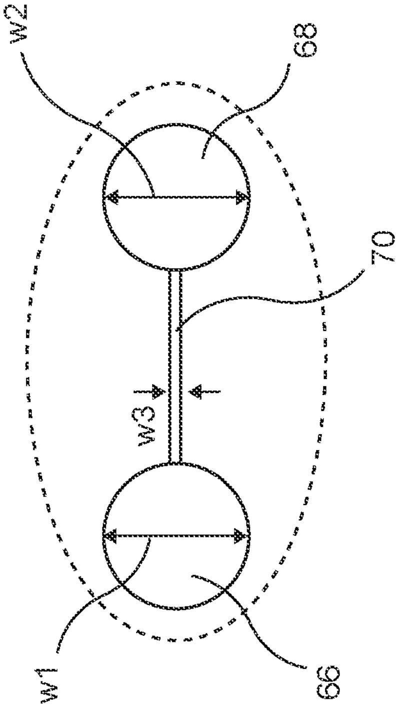
FIG. 3A is an enlarged plan view of a portion of the element illustrated in FIG. 2A.

In some embodiments, the first routing trace 20 can comprise an elongate conductive feature having a trace width that is narrower than a maximum width of the first contact pad 16 and/or a maximum width of the second contact pad 18 (see FIG. 3A). In some other embodiments, the elongate conductive feature can be continuous with, and formed from the same deposition or same conductive layer as, the first contact pad 16 and the second contact pad 18. The first routing trace 20 can extend laterally from the first contact pad 16 in the first bonding layer 10. In some embodiments, the first routing trace 20 can connect the first contact pad 16 and the second contact pad 18. The first routing trace 20 can provide a redistribution layer (RDL) function to the first bonding layer 10.

In some embodiments, the first via 22 can be electrically connected with the first contact pad 16, and the second via 24 can be electrically connected with the first routing trace 20. For example, the first via 22 can connect to an electronic circuit in the first active layer 14, and the second via 24 can connect to a different electronic circuit in the first active layer 14. In some embodiments, the first via 22 and/or the second via 24 can extend through a thickness of the first via layer 12. For example, the first via 22 and the second via 24 and the portions of the first active layer 14 can be electrically connected through the routing layer 15. The first active layer 14 can comprise an electrical circuit (not shown) formed in and on semiconductor material, including transistors and other electrical devices, and can include back end of line (BEOL) metallization layers interconnecting the devices. In some embodiments, the first via 22 and/or the second via 24 can electrically connect the first contact pad 16 to the electrical circuit of the first active layer 14. In some embodiments, the via layer 12 can be formed over and communicate with BEOL (e.g., interconnects, die pads) of the first active layer 14 at a stage when RDL is typically formed (e.g., at the wafer level or reconstituted wafer level prior to dicing). In other embodiments, the via layer can be omitted and bonding layer contact pads can directly connect to underlying BEOL of the active layer. In some embodiments, the first contact pad 16 can be electrically connected to the second contact pad 18 via the routing trace 20, the first via 22 can be electrically connected with the first contact pad 16, but there may be no second via 24 directly connecting the routing trace 20.

The first element can be configured to bond to another element (the second element 2). In some embodiments, the second element 2 can have the same or generally similar structure as the first element 1. The second element 2 can comprise a second bonding layer 30, a second via layer 32, and a second active layer 34. The second bonding layer 30 can comprise a non-conductive material 31, a third contact pad 36, a fourth contact pad 38, and a second routing trace 40 extending from the third contact pad 36 but not in contact with the fourth contact pad 38. The second via layer 32 can comprise a third via 42 and a fourth via 44. In some embodiments, the third contact pad 36, the fourth contact pad 38, and the second routing trace 40 can be exposed on a bonding surface 30*a* of the second bonding layer 30. In some embodiments, the non-conductive material 31, the third contact pad 36, the fourth contact pad 38, and the second routing trace 40 can be coplanar with each other on the bonding surface 30*a*. Unless otherwise noted, components of the second element 2, including low roughness, surface activation and recesses of the conductive features relative to the non-conductive features, may be the same as or generally similar to like components of the first element 1.

As shown in FIG. 1B, the first element 1 and the second element 2 can be bonded along a bonding interface 45 to form the bonded structure 3. In some embodiments, the first element 1 can be directly bonded with the second element 2 such that the first contact pad 16 is directly bonded with the third contact pad 36 without an intervening adhesive, and/or the second contact pad 18 is directly bonded with the fourth contact pad 38 without an intervening adhesive. In some embodiments, the non-conductive material 11 of the first bonding layer 10 and the non-conductive material 31 of the second bonding layer 30 can be directly bonded without an intervening adhesive. In some embodiments, the routing trace 20 of the first element 1 can be in direct contact with the non-conductive material 31 of the second element 2, and similarly the routing trace 40 of the second element 2 can be in direct contact with the non-conductive material 11 of the first element. In some embodiments, a portion of the routing race 20 can be directly bonded to the third contact pad 36 or the fourth contact pad 38, and the routing trace 40 can be directly bonded to the first contact pad 16 or a fifth contact pad 50, due to misalignment of the first element 1 and the second element 2. In some other embodiments, a portion of the routing trace 20 can be directly bonded to the portion of another routing trace (not shown) exposed at the surface of the second bonding layer 30 of the second element 2.

The first bonding layer 10 can comprise the fifth contact pad 50, and the second bonding layer 30 can comprise a sixth contact pad 52. The fifth contact pad 50 and the sixth contact pad 52 can be directly bonded to one another without an intervening adhesive. In some embodiments, the second routing trace 40 can extend laterally from the third contact pad 36 in the second bonding layer 30. In some embodiments, the second routing trace 40 can connect the third contact pad 36 and the sixth contact pad 52.

In some embodiments, the third via 42 can be electrically connected with the sixth contact pad 52, and the fourth via 44 can be electrically connected with the second routing trace 40. In some embodiments, the third via 42 and/or the fourth via 44 can extend through a thickness of the second via layer 32. In some embodiments, the third via 42 and/or the fourth via 44 can electrically connect the sixth contact pad 52 to the electrical circuit of the second active layer 34.

In some embodiments, the first element 1 and the second element 2 can comprise additional contact pads and routing traces. A routing-included bonding layer, such as the first bonding layer 10 and the second bonding layer 30, that includes both bonding pads and a routing trace (the first routing trace 20 and the second routing trace 40) can enable an element (the first element 1 and the second element 2) to rout or redistribute an electrical connection laterally within the routing-included bonding layer without having an additional layer, such as an underlying separate redistribution (RDL) layer, for routing the electrical connection. The routing-included bonding layer can reduce manufacturing cost, simplify manufacturing method, and reduce thickness of the element. In some applications, the routing-included bonding layer can improve manufacturing yield. Of course, in other embodiments, the benefits of routing combined with bonding pads in the same metal layer and by the same patterning steps can be combined with additional routing layers, such as the routing structure 13 and/or additional routing layer(s) (not shown) between the illustrated first bonding layer 10 and the first via layer 12.

Figure 2B:
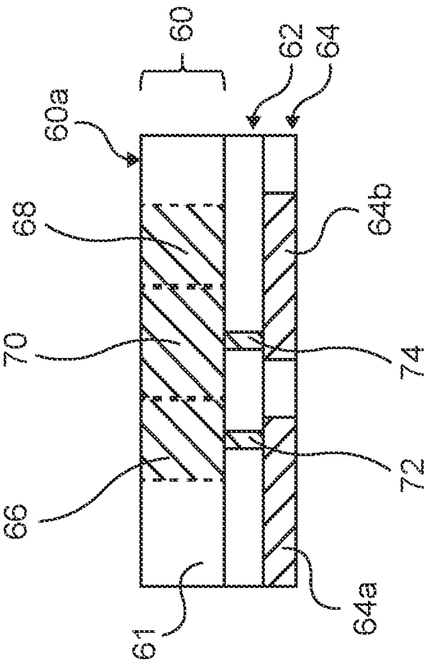
FIG. 2B is a schematic cross sectional side view of apportion of the element illustrated in FIG. 2A.
Figure 2A:
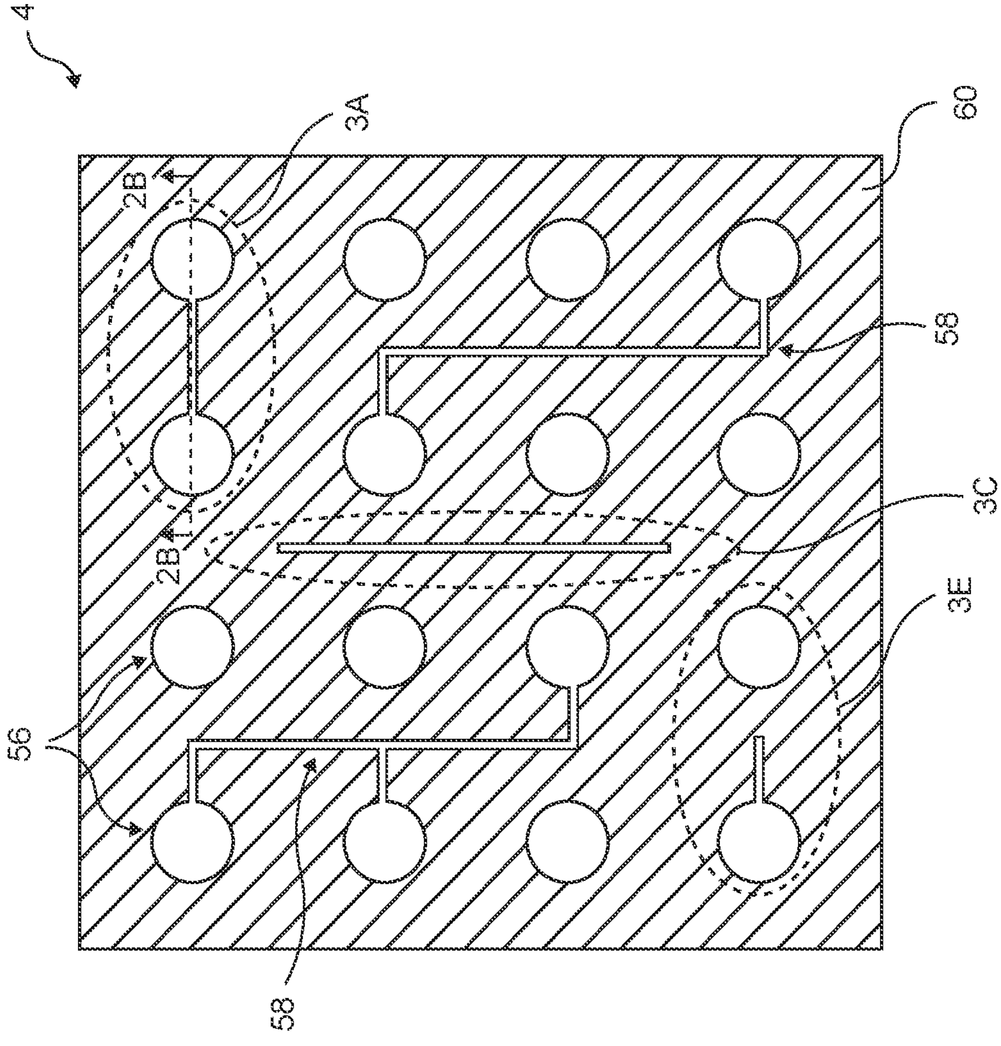
FIG. 2A is a schematic bottom plan view of an element 4 having a routing structure in a bonding layer 60.
Figure 3D:
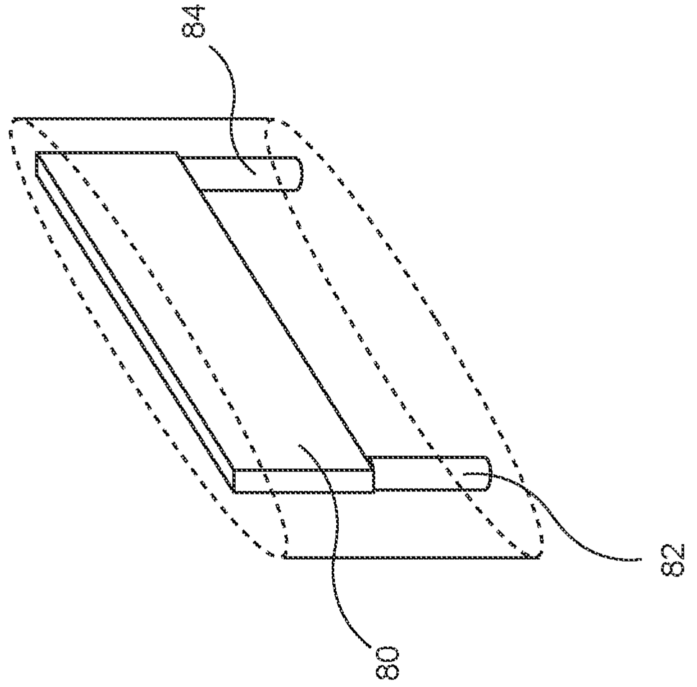
FIG. 3D is a schematic perspective view of the portion of the element illustrated in FIG. 3C.
Figure 3C:
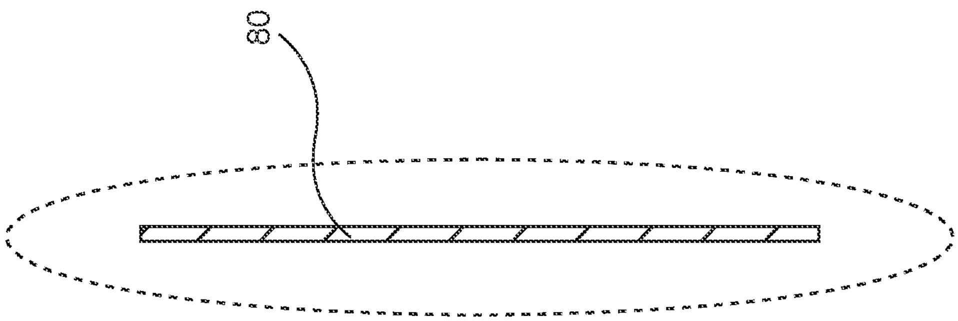
FIG. 3C is an enlarged plan view of another portion of the element illustrated in FIG. 2A.
Figure 3F:
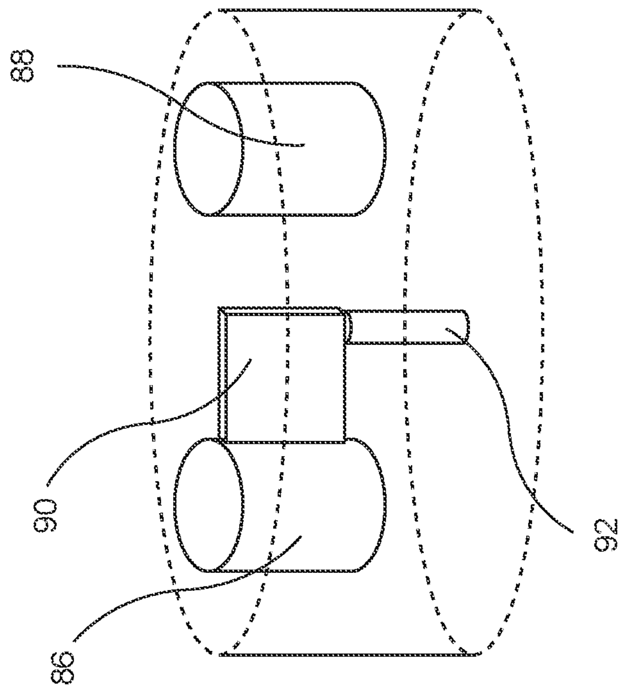
FIG. 3F is a schematic perspective view of the portion of the element illustrated in FIG. 3E.
Figure 3E:
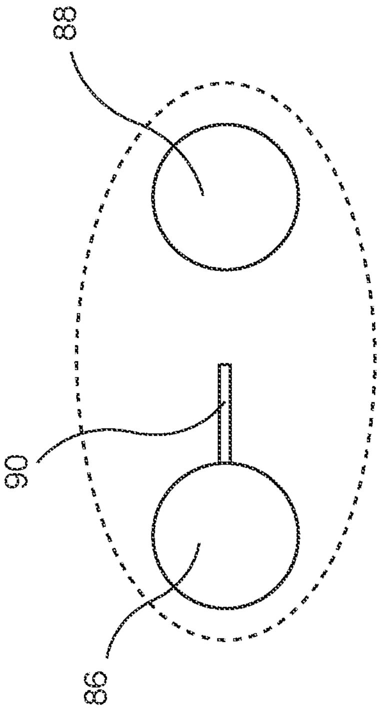
FIG. 3E is an enlarged plan view of another portion of the element illustrated in FIG. 2A.

FIG. 2A is a schematic bottom plan view of an element 4 having a routing structure in a bonding layer 60. FIG. 2B is a schematic cross sectional side view of apportion of the element 4 illustrated in FIG. 2A. FIG. 3A is an enlarged plan view of a portion of the element 4 illustrated in FIG. 2A. FIG. 3B is a schematic perspective view of the portion of the element 4 illustrated in FIG. 3A. FIG. 3C is an enlarged plan view of another portion of the element 4 illustrated in FIG. 2A. FIG. 3D is a schematic perspective view of the portion of the element 4 illustrated in FIG. 3C. FIG. 3E is an enlarged plan view of another portion of the element 4 illustrated in FIG. 2A. FIG. 3F is an schematic perspective view of the portion of the element 4 illustrated in FIG. 3E.

The bonding layer 60 of the element 4 can include a plurality of contact pads 56 and a plurality of routing traces 58. Unless otherwise noted, components of FIGS. 2A-3F may be the same as or generally similar to like components of FIGS. 1A and 1B. In various figures, the plurality of contact pads 56 are shown as circular pads. However, the contact pads 56 can have any suitable shape, such as a rectangular (e.g., square) shape, an octagonal shape, etc.

Referring to FIGS. 2B, 3A, and 3B, the element 4 can comprise the bonding layer 60 that includes a non-conductive material 61, a first contact pad 66, a second contact pad 68, and a routing trace 70, a via layer 62 that includes a first via 72 and a second via 74, and an active layer 64 that includes first circuitry 64*a* and second circuitry 64*b*. The bonding layer 60 can have a bonding surface 60*a* that is configured to bond to another element. In some embodiments, the bonding surface 60*a* of the bonding layer 60 can be configured to bond to another element such that the first contact pad 66 and the second contact pad 68 are directly bonded to corresponding conductive features (e.g., contact pads) without an intervening adhesive. The non-conductive material 61 can be configured to directly bond to a corresponding non-conductive material of the other element.

In some embodiments, the first via 72 can electrically connect the first contact pad 66 to the first circuitry 64*a*, and the second via 74 can electrically connect the second contact pad 68 to the second circuitry 64*b*. The via layer can include any suitable number of vias.

Referring to FIG. 3*a*, the first contact pad 66 has a maximum width w1, and the second contact pad 68 has a maximum width w2. In some embodiments, the widths w1, w2 of the first contact pad 66 and the second contact pad 68 can be the same or generally similar. In some embodiments, the routing trace 70 can comprise an elongate conductive feature having a trace width w3 that is narrower than the width w1 of the first contact pad 16 and/or the width w2 of the second contact pad 68. In some embodiments, the width w1 of the first contact pad 66 and/or the width w2 of the second contact pad 68 can be at least, for example, two times, three times, five times, or ten times larger than the trace width w3 of the routing trace 70.

Referring to FIGS. 3C and 3D, the bonding layer 60 of the element 4 can comprise an elongate conductive structure that serves as a routing trace 80. The routing trace 80 can be configured to electrically connect elements through vias 82, 84 that are connected to different portions of the routing trace 80. As explained below with respect to FIGS. 6A-6C, such elongate conductive structures can alternatively or additionally serve as contact features in conjunction with elongate conductive structures on an opposite directly bonded element. In some embodiments, the routing trace 80 can comprise a contact portion that can function as a contact pad, and a routing portion that provides a routing function between the vias 82, 84.

Referring to FIGS. 3E and 3F, the bonding layer 60 of the element 4 can comprise a contact pad 86, another contact pad 88, and a routing trace 90 that laterally extends from the contact pad 86 in the conductive layer 60. The element 4 can include a via 92 that is connected to a portion of the routing trace 90. The routing trace 90 can serve an RDL function to shift position of the contact pad 86 relative to the underlying via 92 and die pads or interconnects to which it connects. Although FIGS. 3B and 3F show traces 70, 90 with lower surfaces that are elevated relative to the lower surfaces of the contact pads 66, 68, 86, 88 of the same bonding layers, the skilled artisan will appreciate from the description of processing techniques described below that that the traces and contact pads can be coplanar at their bottom surfaces opposite at the bonding surface 60*a*. Additionally, top surfaces of the contact pads 86, 88 may be recessed slightly more than the corresponding traces 70, 90 due to differential dishing of differently dimensioned metal features during polishing (e.g., CMP), as will be understood by the skilled artisan.

In various embodiments disclosed herein, a routing structure may be illustrated as an example of a routing structure. However, in some embodiments, the routing structure may comprise other structures that can laterally route electrical connections, such as signal, ground, or power connections, within a bonding layer. In some embodiments, a routing trace can comprise multiple routing lines, or curved or non-straight lines, and not limited to a single straight conductive line or trace.

Figure 4F:
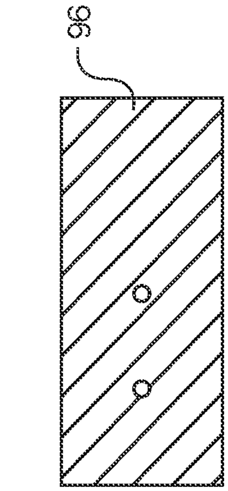
FIGS. 4F and 4G show schematic top plan views of first and second mask layers used in the manufacturing process of FIGS. 4A to 4E.
Figure 4G:
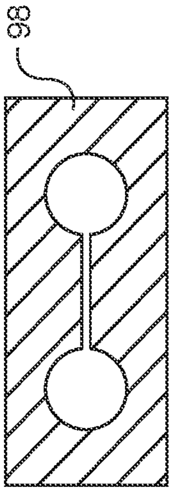

FIGS. 4A to 4E show a manufacturing process of forming an element 5 according to an embodiment. FIGS. 4F and 4G show schematic top plan views of first and second mask layers 96, 98 used in the manufacturing process. Unless otherwise noted, components of FIGS. 3A-4G may be the same as or generally similar to like components disclosed herein.

Figure 4A:
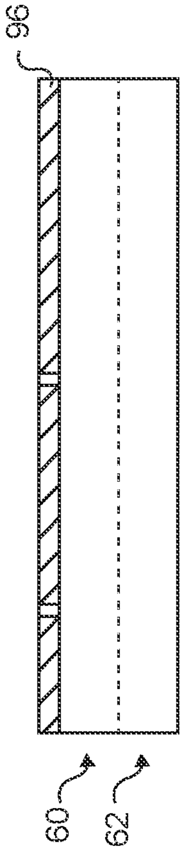
FIGS. 4A to 4E show a manufacturing process of forming an element according to an embodiment.

FIG. 4A is a schematic cross sectional side view of a structure having a bonding layer 60 and a via layer 62 in a step of the manufacturing process. While a dual damascene process is described to simultaneously deposit vias in the via layer 62 and traces/pads in the bonding layer 60, the skilled artisan will appreciate that the principles and advantages taught herein are applicable even if the vias of the via layer 62 are formed prior to forming the bonding layer 60.

Figure 4B:
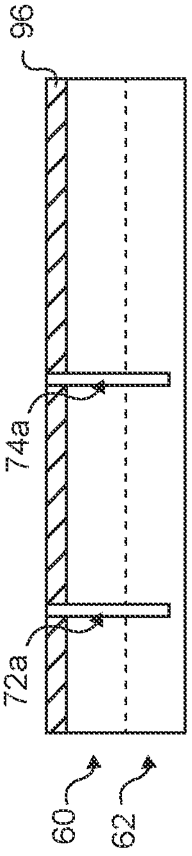

At FIG. 4A, the first mask layer 96, such as patterned resist, can be provided on the bonding layer 60. FIG. 4B is a schematic cross sectional side view of the structure having via holes 72*a*, 74*a*, in another step of the manufacturing process. At FIG. 4B, the via holes 72*a*, 74*a* can be formed through both bonding layer 60 and the via layer 62. In some embodiments, the via holes 72*a*, 74*a* can be formed by way of etching.

Figure 4C:
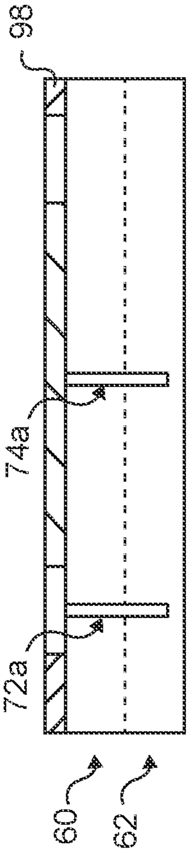
Figure 4D:
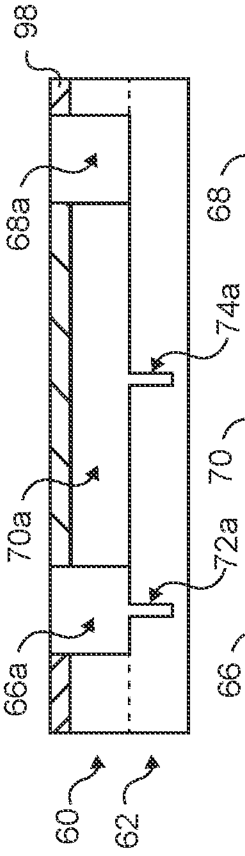

FIG. 4C is a schematic cross sectional side view of the structure after removal of or modification of the first mask layer 96 and formation of the second mask layer 98 on the bonding layer 60. FIG. 4D is a schematic cross sectional side view of the structure having cavities 66*a*, 68*a*, 70*a*, in another step of the manufacturing process. In some embodiments, the cavities 66*a*, 68*a*, 70*a* can be formed by way of etching.

Figure 4E:
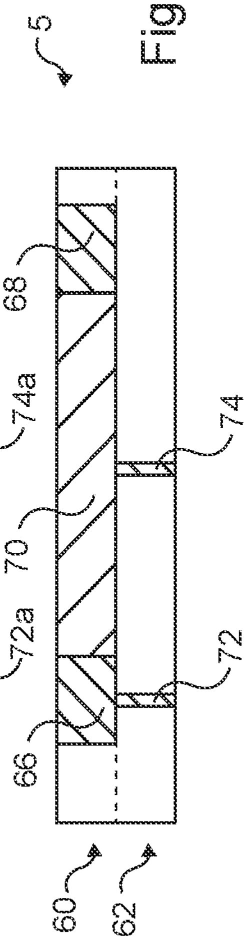

At FIG. 4E, the contact pads 66, 68, routing trace 70, and vias 72, 74 can be formed in the cavities 66*a*, 68*a*, 70*a*, respectively. In some embodiments, the routing trace 70 have a relatively narrow line with the same depth or thickness as the contact pads 66, 68. In some embodiments, the contact pads 66, 68, routing trace 70, and vias 72, 74 can be formed by providing a conductive material, such as copper, therein. For example, the conductive material can be provided by way of barrier and seed deposition (e.g., by PVD) and copper plating, followed by polishing back the copper overburden, as is known in damascene processing. In some embodiments, the contact pads 66, 68 and routing trace 70, can be formed by a single damascene process over preexisting vias, or the via layer 62 can be omitted. In the illustrated embodiment, a dual damascene process is used to simultaneously fill the via holes 72*a*, 74*a* that were defined by the first mask layer 96 (FIG. 4B). Vias 72, 74 formed using a dual damascene process can be referred to as dual damascene vias.

It will be understood that, in this, with or without dual damascene processing, and with or without an underlying via layer, the trace 70 and contact pads 66, 68 are formed from the same deposition(s) (e.g., barrier and seed deposition PVD and copper plating), and the same metal layer(s). Furthermore, the patterns of the trace 70 and contact pads 66, 68 are define by the same mask 98.

Figure 5B:
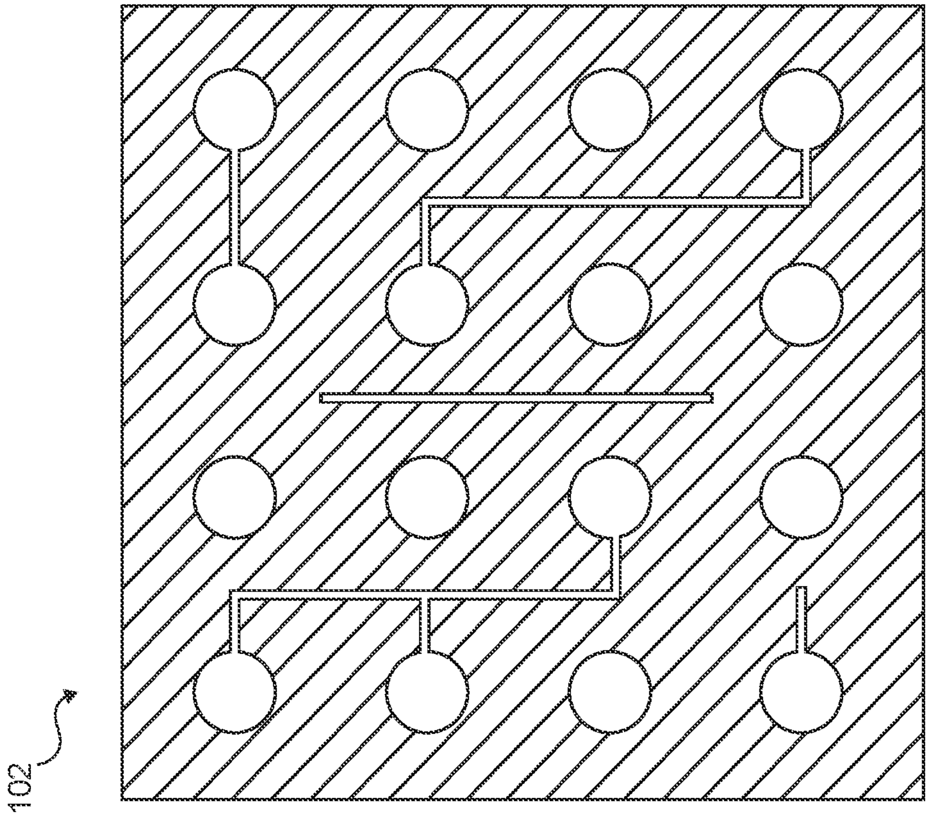
FIG. 5B is a schematic top plan view of a mask layer for forming contact pads and routing structures in a bonding layer of an element.
Figure 5A:
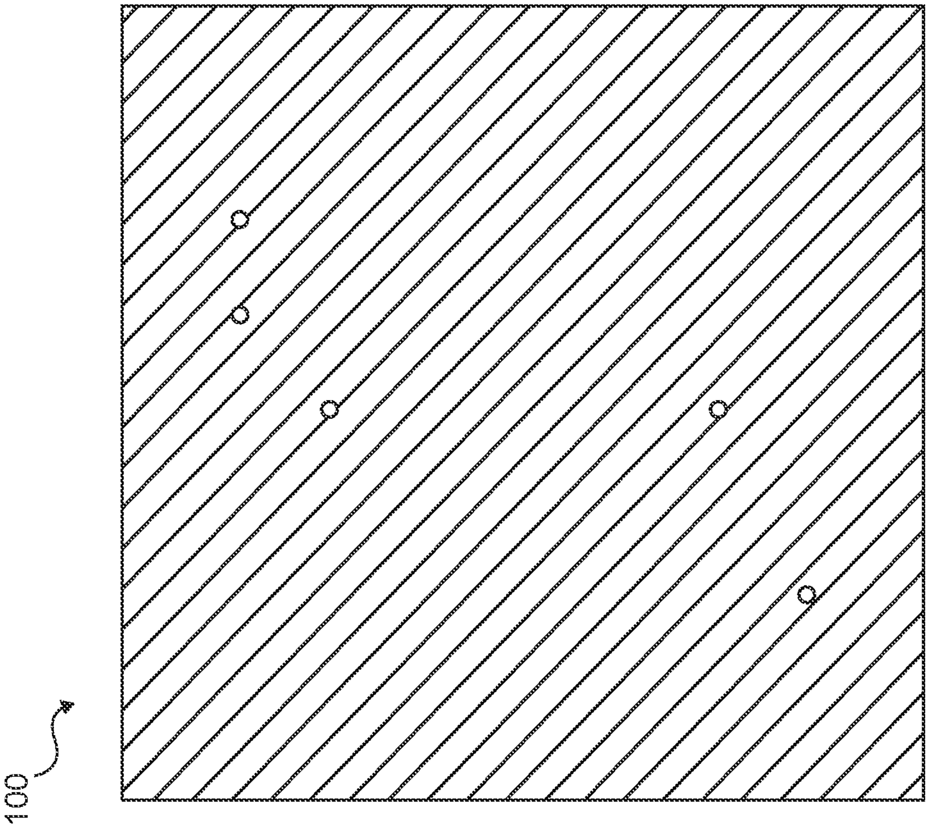
FIG. 5A is a schematic top plan view of a mask layer for forming vias in a via layer of an element.

FIG. 5A is a schematic top plan view of a mask layer 100 for forming vias in a via layer of an element. FIG. 5B is a schematic top plan view of a mask layer 102 for forming contact pads and routing structures, such as routing traces, in a bonding layer of an element. In some embodiments, the mask layer 100 and/or the mask layer 102 can be used to form the element 4 illustrated in FIGS. 2A-3F. The mask layers 100, 102 may be used in a process that is the same or similar to the manufacturing process described with respect to FIGS. 4A to 4E.

Figure 6B:
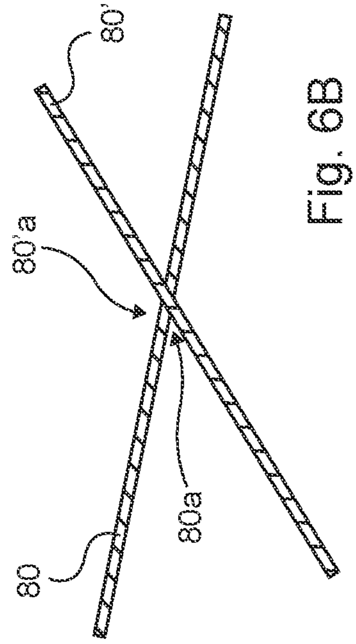
FIG. 6B shows the elongate conductive structures of FIG. 6A after bonding.
Figure 6C:
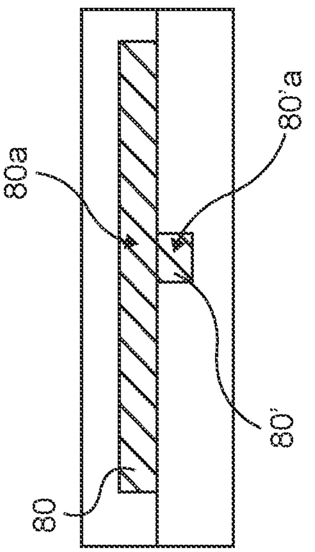
FIG. 6C is a schematic cross sectional side view of a bonded structure that includes the elongate structures of FIG. 6A.
Figure 6A:
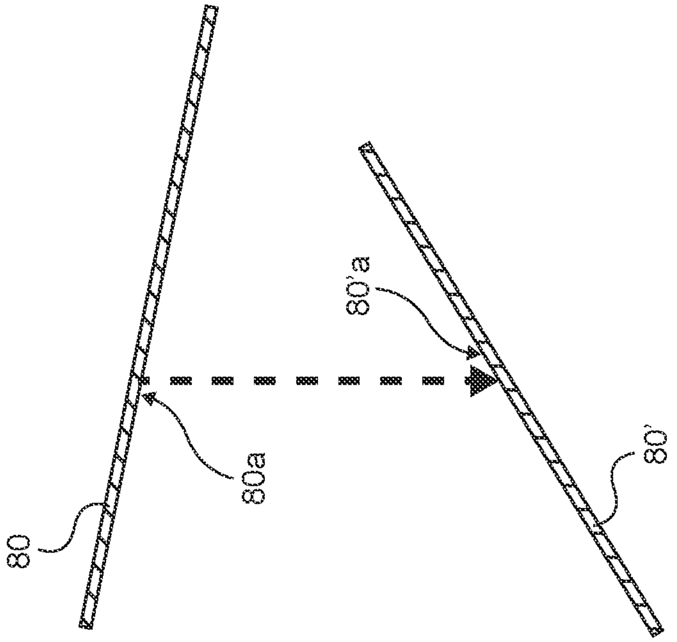
FIG. 6A shows the elongate conductive structure of the element illustrated in FIGS. 2A, 3C and 3D, and an elongate conductive structure of another element, prior to bonding.

FIG. 6A shows the elongate conductive structure 80 of the element 4 illustrated in FIGS. 2A, 3C and 3D, and an elongate conductive structure 80' of another element, prior to bonding. FIG. 6B shows the elongate conductive structure 80 and the elongate conductive structure 80' after bonding. FIG. 6C is a schematic cross sectional side view of a bonded structure that includes the elongate structure 80 and the elongate conductive structure 80'.

A contact location 80*a* of the elongate conductive structure 80 and a contact location 80'*a* of the elongate conductive structure 80' can be bonded to one another. In some embodiments, the contact location 80*a* of the elongate conductive structure 80 and the contact location 80'*a* of the elongate conductive structure 80' can be directly bonded to one another without an intervening adhesive. The use of crossing lines in the bonding layers as contact pads provides wider alignment margins. The elongate conductive structure 80 and/or the elongate conductive structure 80' can be connected to a plurality of vias, as disclosed herein, thereby providing electrical routing between the vias.

Figures 7A, 7B:
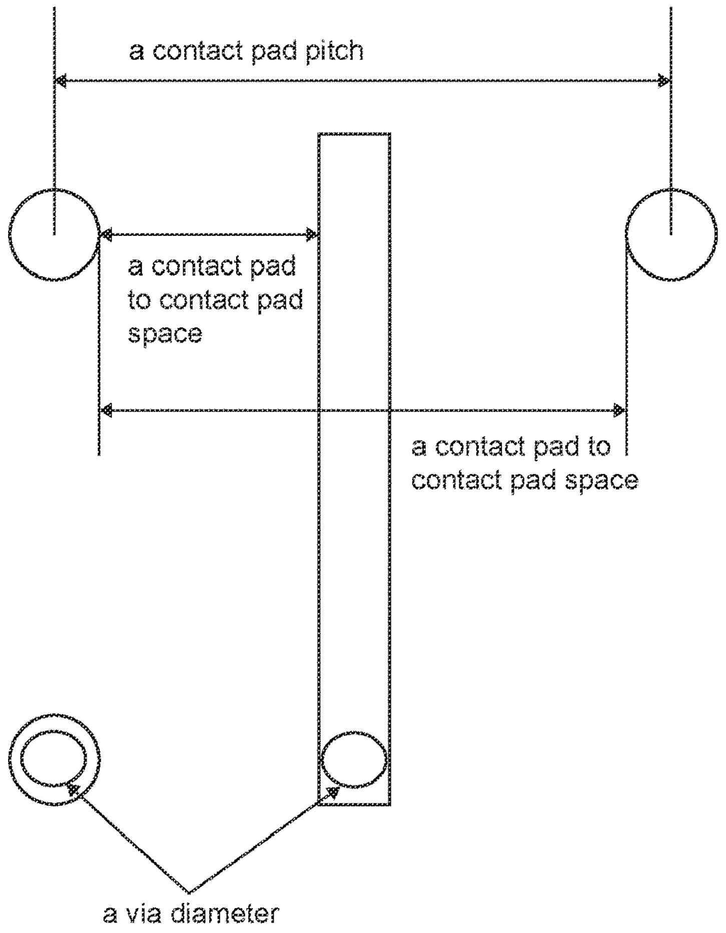
FIG. 7A is a chart showing example dimensions of components in a bonding layer.
FIG. 7B schematically illustrates locations of the dimensions shown in FIG. 7A.

FIG. 7A is a chart showing example dimensions of a contact pad diameter, a contact pad pitch, a contact pad to contact pad space, a maximum routing trace width, a contact pad to routing trace space, a ratio of contact pad to contact pad space to contact pad to routing space, and a via diameter. FIG. 7B schematically illustrates locations of the dimensions shown in FIG. 7A. In some embodiments, the contact pad diameter, the contact pad pitch, the contact pad to contact pad space, the maximum routing trace width, the contact pad to routing trace space, the ratio of contact pad to contact pad space to contact pad to routing space, and the via diameter can be smaller or larger than those shown in FIG. 7A. For example, each of the contact pad diameter, the contact pad pitch, the contact pad to contact pad space, the maximum routing trace width, the contact pad to routing trace space, the ratio of contact pad to contact pad space to contact pad to routing space, and the via diameter can range between 1%, 3%, 5%, 10% or 20% of the values shown in FIG. 7A (for example, the listed value can include the value +/−1%, 3%, 5%, 10%, or 20%). In some embodiments, the contact pad diameter can be in a submicron scale. In some embodiments, the via diameter can be in a range of, for example, 0.2 μm to 50 μm, 0.2 μm to 25 μm, 0.2 μm to 10 μm, 0.2 μm to 5 μm, 0.2 μm to 2 μm, 2 μm to 50 μm, 40 μm to 50 μm, or 10 μm to 25 μm. The contact pad pitch can be in a range of, for example, 0.4 μm to 5 μm, 0.4 μm to 2 μm, 0.4 μm to 0.9 μm, 0.6 μm to 5 μm, or 0.8 μm to 2 μm.

Figure 8B:
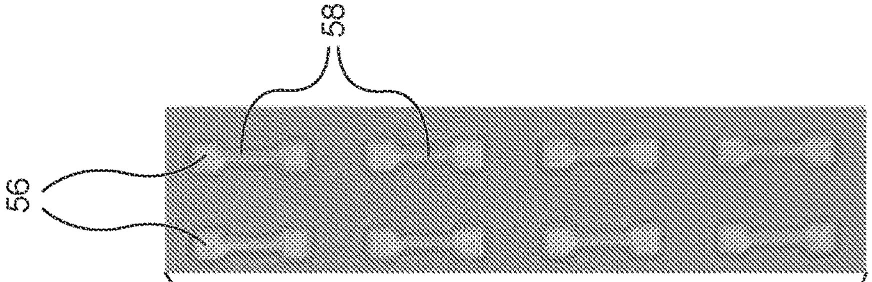
FIG. 8B is an enlarged view of a portion of the element shown in FIG. 8A.
Figure 8A:
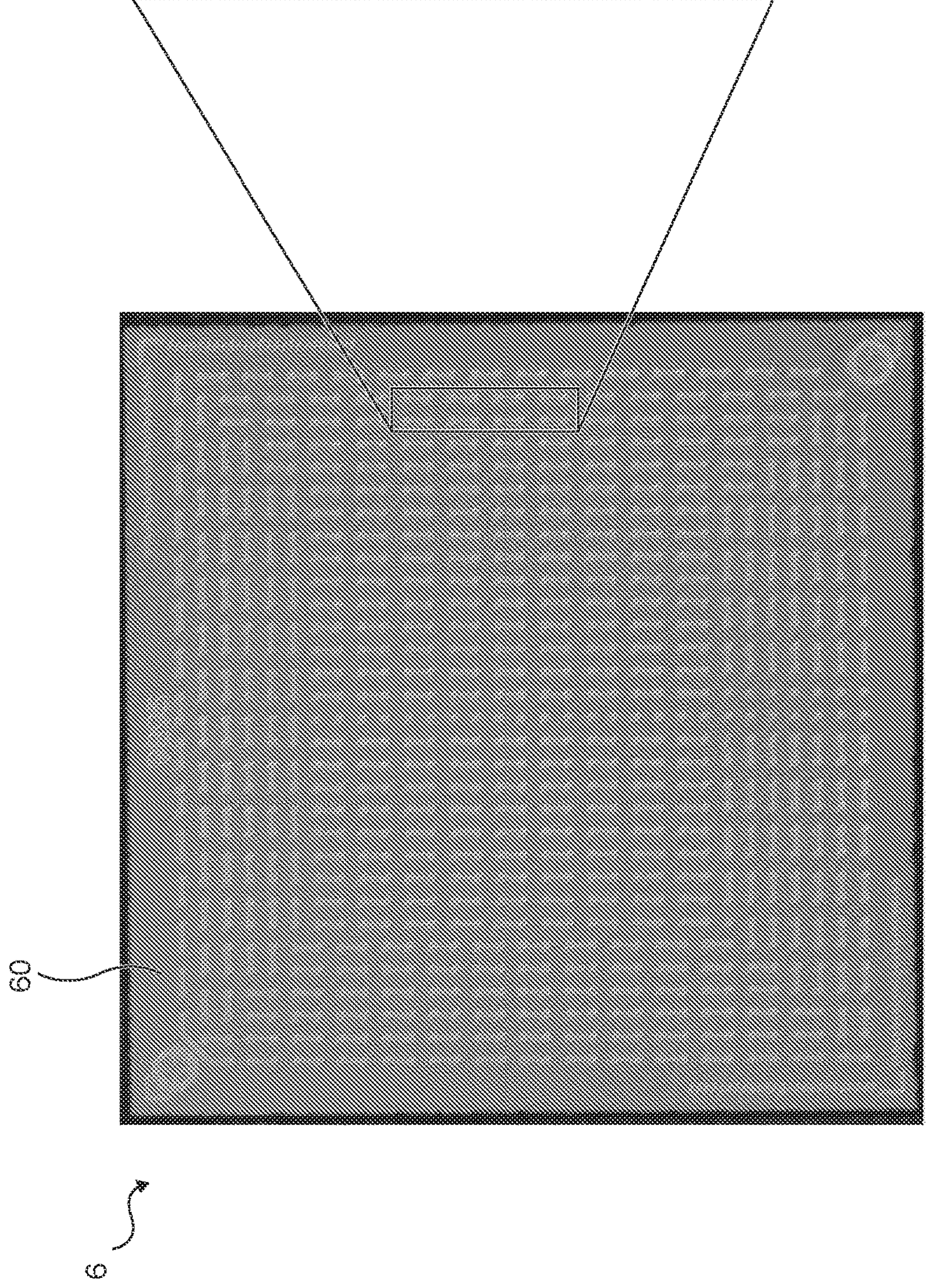
FIG. 8A is a bottom plan view of an element having a routing structure in a bonding layer according to an embodiment.

FIG. 8A is a bottom plan view of an element 6 having a routing structure in a bonding layer 60. FIG. 8B is an enlarged view of a portion of the element 6 shown in FIG. 8A. The bonding layer 60 of the element 6 can include a plurality of contact pads 56 and a plurality of routing traces 58. Unless otherwise noted, components of FIGS. 8A and 8B may be the same as or generally similar to like components disclosed herein. FIGS. 8A and 8B shows that the plurality of contact pads 56 can comprise polygonal (e.g., rectangular or square) pads, in some embodiments.

Figure 9:
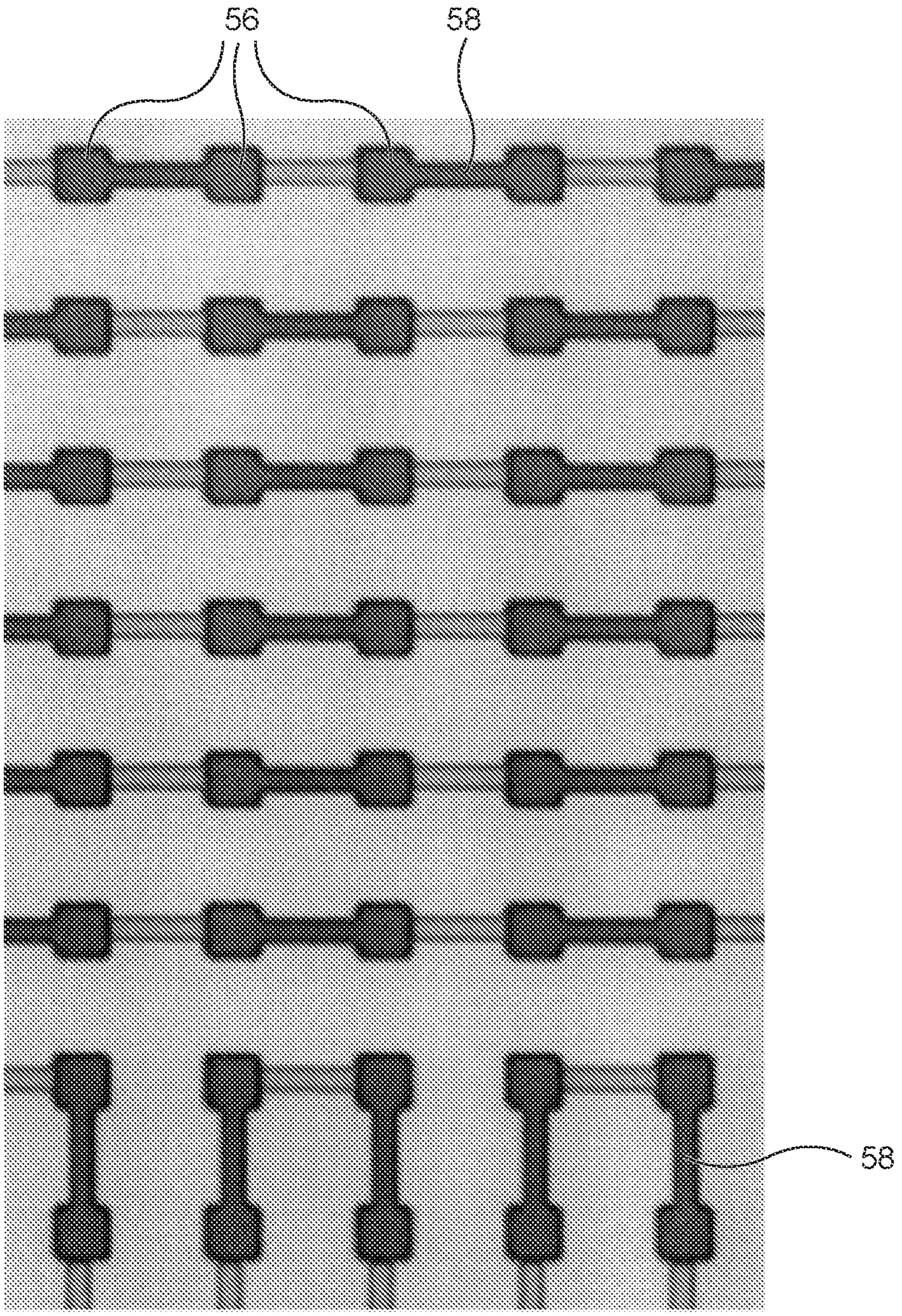
FIG. 9 is an infrared (IR) image of at or near a bonding interface of a bonded structure.

FIG. 9 is an infrared (IR) image of at or near a bonding interface of a bonded structure. As shown in FIG. 9, two or more contact pads 56 can be routed in the bonding layer through the routing traces 58. Though the routing traces 58 shown in FIG. 9 connects adjacent pads 56, the routing traces 58 can connect remote pads in some embodiments.

In one aspect, a bonded structure is disclosed. The bonded structure can include a first element that includes a first bonding layer. The first bonding layer has a first contact pad and a routing trace. The routing trace is formed at the same level as the first contact pad. The bonded structure can include a second element that includes a second bonding layer having a second contact pad. The first bonding layer of the first element and the second bonding layer of the second element are directly bonded such that the first contact pad and the second contact pad are directly bonded without an intervening adhesive.

In one embodiment, the first bonding layer further includes a third contact pad. The second bonding layer can further include a fourth contact pad. The third contact pad and the fourth contact pad can be directly bonded to one another without an intervening adhesive.

In one embodiment, the routing trace has a maximum trace width that is narrower than a maximum width of the first contact pad.

In one embodiment, the routing trace contacts and laterally extends from the first contact pad.

In one embodiment, the routing trace and the first contact pad are formed from the same conductive material(s).

In one embodiment, the first element further includes a first via layer on a side of the bonding layer opposite the second element. The first via layer can include a via extending through a thickness of the first via layer. The first element can further include an electronic circuit. The first via can electrically connect the first contact pad and the electronic circuit. The first element can further include a routing structure. The first via can electrically connect the first contact pad and the routing structure. The routing structure can include a redistribution layer.

In one embodiment, the second bonding layer of the second element further includes a second routing trace.

In one embodiment, a thickness of the first contact pad defines a thickness of the first bonding layer.

In one embodiment, the first element includes a plurality of contact pads including the first contact pad. A diameter of at least one of the plurality first contact pad can be less than 5 microns.

In one aspect, a bonded structure is disclosed. The bonded structure can include a first element that includes a first bonding layer. The first bonding layer has a first contact pad and a routing trace connected to the first contact pad. The routing trace extends laterally from the first contact pad in the first bonding layer. The routing trace and the first contact pad are formed from the same conductive materials. The bonded structure can include a second element that includes a second bonding layer having a second contact pad. The first element and the second element are directly bonded such that the first contact pad and the second contact pad are directly bonded without an intervening adhesive.

In one aspect, a bonded structure is disclosed. The bonded structure can include a first element that includes a first bonding layer. The first bonding layer has a first contact pad and a routing trace. The bonded structure can include a second element that includes a second bonding layer having a second contact pad. The first element and the second element are directly bonded along an bond interface such that the first contact pad and the second contact pad are directly bonded without an intervening adhesive. The routing trace and the first contact pad are disposed along the bond interface.

In one embodiment, he routing trace contacts non-conductive material of the second bonding layer In one aspect, a bonded structure is disclosed. The bonded structure can include a first element that includes a first bonding layer having a bonding side and a back side opposite the bonding side and a via layer on the back side of the first bonding layer. The first bonding layer includes an elongate conductive feature in electrical contact with two vias of the via layer. The bonded structure can include a second element that includes a second bonding layer having a conductive feature. The first element and the second element are directly bonded such that the elongate conductive feature is in contact with the second bonding layer.

In one embodiment, the elongate conductive feature of the first element is in direct contact with the conductive feature of the second element.

In one embodiment, the first element includes a contact pad that is connected to the elongate conductive feature. The contact pad can be directly bonded to the conductive feature of the second element.

In one aspect, an element having a bonding layer is disclosed. The element can include a first contact pad that is embedded in non-conductive material of the bonding layer. An upper surface of the first contact pad is not covered by the non-conductive material of the bonding layer. The element can include a routing trace that is embedded in the non-conductive material of the bonding layer. An upper surface of the routing trace is not covered by the non-conductive material of the bonding layer. The bonding layer is configured to directly bond to another element without an intervening adhesive.

In one embodiment, the routing trace laterally connects the first contact pad and a second contact pad.

In one embodiment, the routing trace is formed at the same metal level as the first contact pad.

In one embodiment, the routing trace is formed from the same metal layer(s) as the first contact pad.

In one embodiment, the non-conductive material of the bonding layer has a surface roughness less than about 20 Å rms. The contact pad and the routing trace are recessed below an upper surface of the non-conductive material of the bonding layer by less than or equal to about 20 nm. The non-conductive material of the bonding layer can include nitrogen and/or fluorine doping in an amount suitable for directly bonding to a similar non-conductive material of a second element.

In one aspect, an element having a bonding layer is disclosed. The element can include a first contact pad in the bonding layer, and a routing trace in the bonding layer. The first contact pad and the routing trace are exposed at a bonding surface of the bonding layer. The bonding surface of the bonding layer is configured to directly bond to another element without an intervening adhesive.

In one embodiment, the routing trace electrical connects to a via in a via layer beneath the bonding layer.

In one embodiment, the routing trace extends from the first contact pad.

In one embodiment, the routing trace extends between the first contact pad and a second contact pad in the bonding layer.

In one embodiment, the routing trace extends from the first contact pad.

In one embodiment, the routing trace has a width narrower than a maximum width of the first contact pad.

In one aspect, a method of forming an element that is configured to directly bond with another element is disclosed. The method can include removing portions of a bonding layer of the element from a bonding surface of the bonding layer, providing a conductive material to the removed portions of the bonding layer to form a contact pad and a routing trace, and preparing the bonding surface for direct bonding. The routing trace extending laterally from the contact pad in the bonding layer.

In one aspect, a method of forming an element that is configured to bond with another element. The method includes patterning a conductive layer to form a contact pad and a routing trace, embedding, at least partially, the contact pad and the routing trace in a non-conductive material, and polishing surfaces of the contact pad, the routing trace, and the non-conductive material to prepare for direct bonding.

In one embodiment, patterning and embedding includes a damascene process using a single mask to define cavity patterns for the contact pad and the routing trace, and depositing the conductive layer into the cavity patterns.

In one embodiment, the method further includes patterning a via holes in via layer below the bonding layer using an additional mask. Depositing the conductive layer into the conductive layer can include simultaneously filling the via holes in a dual damascene process. Depositing the conductive layer can include depositing a barrier layer, a seed layer and an electroplated copper layer.

In one aspect, a method of forming a bonded structure is disclosed. The method can include providing a first element that includes a first bonding layer. The first bonding layer has a non-conductive material, a first contact pad and a routing trace. The routing trace is formed at the same metal level as the first contact pad. The method can include polishing surfaces of the first contact pad, the routing trace, and the non-conductive material to prepare for direct bonding.

In one embodiment, the method further includes providing a second element including a second bonding layer having a second contact pad. The method can further include directly bonding the first element and the second element such that the first contact pad and the second contact pad are directly bonded without an intervening adhesive.

In one aspect, a bonded structure is disclosed. The bonded structure can include a first element that includes a first bonding surface. The first bonding surface has a first contact pad and a routing trace. The bonded structure can include a second element that includes a second bonding surface having a second contact pad. The first element and the second element are directly bonded such that the first contact pad and the second contact pad are directly bonded without an intervening adhesive. The routing trace is in contact with the second bonding surface.

In one embodiment, the first bonding surface further includes a third contact pad. The second bonding surface can further include a fourth contact pad. The third contact pad and the fourth contact pad are directly bonded to one another without an intervening adhesive.

In one embodiment, the routing trace has a maximum trace width that is narrower than a maximum width of the first contact pad.

In one embodiment, the routing trace contacts and laterally extends from the first contact pad.

In one embodiment, the routing trace and the first contact pad are formed from the same conductive material(s).

In one embodiment, the first element further comprises a first via layer. The first via layer can include a via extending through a thickness of the first via layer. The first element can further include an electronic circuit. The first via can electrically connect the first contact pad and the electronic circuit. The first element can further include a routing structure. The first via can electrically connect the first contact pad and the routing structure. The routing structure can include a redistribution layer.

In one embodiment, the second bonding surface of the second element further includes a second routing trace.

In one embodiment, a thickness of the first contact pad is greater than a thickness of the routing trace. The first element comprises a plurality of contact pads including the first contact pad, a diameter of at least one of the plurality first contact pads is less than 5 microns.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A bonded structure comprising:

a first element including a first bonding layer and a via layer, wherein the first bonding layer comprises a first contact pad having a first maximum width and a first length and a routing trace having a second maximum width and a second length, wherein the via layer comprises a via that is electrically and physically connected to the routing trace and that extends through a thickness of the via layer, wherein the routing trace is formed at the same level as the first contact pad, wherein the second length is longer than the first length, and wherein the first maximum width is greater than the second maximum width; and a second element including a second bonding layer having a second contact pad;

wherein the first bonding layer of the first element and the second bonding layer of the second element are directly bonded such that the first contact pad and the second contact pad are directly bonded without an intervening adhesive and wherein the via layer is on a side of the first bonding layer opposite the second element.

2. The bonded structure of claim 1, wherein the first bonding layer further comprises a third contact pad.

3. The bonded structure of claim 2, wherein the second bonding layer further comprises a fourth contact pad, the third contact pad and the fourth contact pad are directly bonded to one another without an intervening adhesive.

4. The bonded structure of claim 1, wherein the routing trace contacts and laterally extends from the first contact pad.

5. The bonded structure of claim 1, wherein the routing trace and the first contact pad are formed from the same conductive material(s).

6. The bonded structure of claim 1, wherein the first element further comprises an electronic circuit, wherein the via electrically connects the routing trace and the electronic circuit.

7. The bonded structure of claim 1, wherein the first element further comprises a routing structure, wherein the via electrically connects the routing trace and the routing structure.

8. The bonded structure of claim 7, wherein the routing structure includes a redistribution layer.

9. The bonded structure of claim 1, wherein the second bonding layer of the second element further comprises a second routing trace.

10. The bonded structure of claim 1, wherein a thickness of the first contact pad defines a thickness of the first bonding layer.

11. The bonded structure of claim 1, wherein the first element comprises a plurality of contact pads including the first contact pad, a diameter of at least one of the plurality first contact pad is less than 5 microns.

12. The bonded structure of claim 1, wherein the first bonding layer of the first element and the second bonding layer of the second element are directly bonded such that a non-conductive material of the first bonding layer and a non-conductive material of the second bonding layer are directly bonded without an intervening adhesive.

13. The bonded structure of claim 1, wherein the first maximum width is at least two times larger than the second maximum width.

14. The bonded structure of claim 1, wherein the first maximum width is at least five times larger than the second maximum width.

15. A bonded structure comprising:

a first element including a first bonding layer and a via layer, wherein the first bonding layer has a bonding side, a back side opposite the bonding side, a first contact pad having a first maximum width, and a first routing trace having a second maximum width that is less than the first maximum width, wherein the first contact pad is connected to the first routing trace, wherein the via layer is formed on the back side of the first bonding layer and comprises a first via, and wherein the first routing trace comprises an elongate conductive feature that is in electrical and physical contact with the first via; and a second element including a second bonding layer having a conductive feature, wherein the first element and the second element are directly bonded such that the elongate conductive feature is in contact with the second bonding layer.

16. The bonded structure of claim 15, wherein the elongate conductive feature of the first element is in direct contact with the conductive feature of the second element.

17. The bonded structure of claim 15, wherein the first contact pad is directly bonded to the conductive feature of the second element.

18. The bonded structure of claim 15, wherein the first maximum width is at least two times larger than the second maximum width.

19. The bonded structure of claim 15, wherein the first maximum width is at least five times larger than the second maximum width.

20. A bonded structure comprising:

a first element including a first bonding surface, the first bonding surface having a first contact pad and a routing trace, wherein the first contact pad has a first length and a first maximum width, wherein the routing trace has a second length and a second maximum width, wherein the second length is longer than the first length, wherein the first maximum width is greater than the second maximum width, and wherein the first element further comprises a via that is in physical and electrical contact with the routing trace; and a second element including a second bonding surface having a second contact pad;

wherein the first element and the second element are directly bonded such that the first contact pad and the second contact pad are directly bonded without an intervening adhesive, and the routing trace is in contact with the second bonding surface.

21. The bonded structure of claim 20, wherein the first bonding surface further comprises a third contact pad, the second bonding surface further comprises a fourth contact pad, the third contact pad and the fourth contact pad are directly bonded to one another without an intervening adhesive.

22. The bonded structure of claim 20, wherein the routing trace contacts and laterally extends from the first contact pad.

23. The bonded structure of claim 20, wherein the routing trace and the first contact pad are formed from the same conductive material(s).

24. The bonded structure of claim 20, wherein the first element further comprises a first via layer that comprises the via, wherein the via extends through a thickness of the first via layer.

25. The bonded structure of claim 20, wherein a thickness of the first contact pad is greater than a thickness of the routing trace.

26. The bonded structure of claim 20, wherein the first maximum width is at least two times larger than the second maximum width.

27. The bonded structure of claim 20, wherein the first maximum width is at least five times larger than the second maximum width.

* * * * *